(12) United States Patent
Tsuchida et al.

(10) Patent No.: US 6,615,309 B2
(45) Date of Patent: Sep. 2, 2003

(54) SEMICONDUCTOR MEMORY DEVICE

(75) Inventors: Kenji Tsuchida, Kawasaki (JP); Haruki Toda, Yokohama (JP); Hitoshi Kuyama, Kawasaki (JP)

(73) Assignee: Kabushiki Kaisha Toshiba, Kawasaki (JP)

(*) Notice: Subject to any disclaimer, the term of this patent is extended or adjusted under 35 U.S.C. 154(b) by 0 days.

(21) Appl. No.: 10/337,977

(22) Filed: Jan. 8, 2003

(65) Prior Publication Data

US 2003/0105916 A1 Jun. 5, 2003

Related U.S. Application Data

(60) Division of application No. 10/175,085, filed on Jun. 20, 2002, which is a continuation-in-part of application No. 09/383,193, filed on Aug. 26, 1999, now Pat. No. 6,484,246.

(30) Foreign Application Priority Data

Aug. 26, 1998 (JP) .......................................... 10-240161
Aug. 19, 1999 (JP) .......................................... 11-232828

(51) Int. Cl.[7] .............................................. G06F 12/02
(52) U.S. Cl. .................................................... 711/106
(58) Field of Search ................................. 711/104, 105, 711/106, 167, 169

(56) References Cited

U.S. PATENT DOCUMENTS

| | | | |
|---|---|---|---|
| 4,360,903 A | * 11/1982 | Plachno et al. | ............. 365/222 |
| 5,323,358 A | 6/1994 | Toda et al. | |
| 5,511,024 A | 4/1996 | Ware et al. | |
| 5,596,541 A | 1/1997 | Toda | |
| 5,717,653 A | 2/1998 | Suzuki | |
| 5,748,558 A | 5/1998 | Suzuki | |
| 5,757,704 A | 5/1998 | Hachiya | |
| 5,973,991 A | 10/1999 | Tsuchida et al. | |
| 5,978,300 A | 11/1999 | Toda | |
| 6,044,429 A | 3/2000 | Ryan et al. | |
| 6,049,490 A | 4/2000 | Kawasumi | |
| 6,125,071 A | 9/2000 | Kohno et al. | |
| 6,151,236 A | 11/2000 | Bondurant et al. | |
| 6,275,437 B1 | * 8/2001 | Kim et al. | ................... 365/222 |
| 6,285,626 B2 | * 9/2001 | Mizuno et al. | ............. 365/233 |
| 6,295,231 B1 | 9/2001 | Toda et al. | |
| 6,324,113 B1 | * 11/2001 | Tomita | ........................ 365/222 |

OTHER PUBLICATIONS

Symposium on VLSI Circuits Digest of Technical Papers, Y. Sato et al., "Fast Cycle RAM (FCRAM); a 20-ns Random Row Access, Pipe-Lined Operating DRAM," Jun. 1998.

* cited by examiner

*Primary Examiner*—Kevin L. Ellis
(74) *Attorney, Agent, or Firm*—Banner & Witcoff, Ltd.

(57) ABSTRACT

A semiconductor memory device. The device includes a bit line, a memory cell coupled to the bit line a word line coupled to the memory cell. A first time between the receiving of a read command for a read operation in order to read data from the memory cell and the beginning of read operation is different from a second time between the receiving of a write command for a write operation in order to write data to the memory cell and the beginning of the write operation.

2 Claims, 15 Drawing Sheets

SEMICONDUCTOR MEMORY DEVICE

CROSS REFERENCE TO RELATED APPLICATIONS

This application is a divisional of prior U.S. application Ser. No. 10/175,085, filed Jun. 20, 2002, which is a continuation of prior U.S. application Ser. No. 09/383,193, filed Aug. 26, 1999, now U.S. Pat. No. 6,484,246, issued Nov. 19, 2002, which claims priority under 35 U.S.C. § 119 to Japanese Patent Application Nos. 10-240161, filed Aug. 26, 1998 and 11-232828, filed Aug. 19, 1999, the entire contents of which are incorporated herein by reference.

This application is also based on Japanese Patent Application No. 10-124367, filed May 7, 1998, Japanese Patent Application No. 10-203454, filed Jul. 17, 1998, Japanese Patent Application No. 11-200515, filed Jul. 14, 1999, U.S. patent application Ser. No. 09/305,752, filed May 6, 1999, now U.S. Pat. No. 5,973,991, U.S. patent application Ser. No. 09/354,102, filed Jul. 15, 1999, now U.S. Pat. No. 6,295,231, the contents of which are incorporated herein by reference.

BACKGROUND OF THE INVENTION

The present invention relates to a semiconductor device in which dynamic RAMs (DRAM cells) are accumulated, and particularly to a DRAM which can improve the data transfer efficiency in a read/write mixed cycle in a high-speed random access cycle.

Of the MOS type semiconductor memory devices, the DRAM is most highly integrated, since the memory cells constituting the device are comparatively simple in structure. Hence, at present, the DRAM is used as a main memory of any type of computer equipment. Recently, as the performance of the microprocessor (MPU) has been rapidly improved, various DRAMs having high-speed data cycle functions to increase the capacity of memories have been proposed or mass production thereof has begun. Typical examples of these DRAMs are a synchronous DRAM (hereinafter referred to as a SDRAM) and a double data rate SDRAM (hereinafter referred to as a DDR-SDRAM). The SDRAM receives and transmits any input and output information in synchronism with a system clock. The DDR-SDRAM performs a similar operation and is accessible at both up and down edges of a clock as triggers.

Further, a rambus DRAM (hereinafter referred to as an RDRAM) and the like have been developed, which can transfer data at higher speed by a protocol-based command. Therefore, the conventional asynchronous DRAMs will inevitably be replaced by synchronous DRAMs in the future.

The synchronous DRAMs are characterized in that the maximum bandwidth (data transfer rate) is very high. For example, the latest SDRAM achieves 100 Mbps in the maximum bandwidth.

Further, it is expected that the maximum bandwidth in the future is 200 Mbps in a DDR-SDRAM and 800 Mbps in an RDRAM.

However, such a high bandwidth is limited to a burst access only in a specific row direction in a memory space.

In other words, in random access wherein the row address is changed, the access speed is as low as that in the conventional asynchronous DRAM. To increase the access speed, the computer system including a DRAM as a main memory generally employs a hierarchical memory structure. More specifically, a cache memory comprising a SRAM, which is accessible at a higher speed as compared to a DRAM, is interposed between the MPU and the DRAM, and part of the information stored in the DRAM is cached in the SRAM. In this structure, the MPU generally accesses the cache memory accessible at a higher speed. It accesses the DRAM only when it receives an access command for an address space which is not cached by the cache memory. By means of this structure, even if there is a difference in speed performance between the MPU and the DRAM, the performance of the computer system can be considerably improved.

However, in case of a cache miss, it is necessary to read information from the DRAM. In particular, when another address in the same block of the DRAM memory space is accessed, the waiting time of the MPU becomes the longest. The problem of the waiting time in, for example, an SDRAM, will be described below with reference to FIG. 1.

FIG. 1 shows an example of the timing chart of a read operation of an SDRAM. In the aforementioned computer system using the hierarchical memory structure, if a cache miss occurs and the SDRAM as the main memory must be accessed, a precharge command (PRECHARGE) is issued from the system at a time t1 to precharge a currently active address of the memory. After a predetermined time elapses, an activate command (ACTIVE) is issued from the MPU, so that the bank corresponding to a required memory space is activated. Further, after the elapse of a predetermined time, a read command (READ) is issued. After a time t2 after a predetermined time has elapsed since the read command, data of a predetermined burst length is read from the SDRAM in synchronism with a clock.

As shown in FIG. 1, the maximum bandwidth is very high when data is read successively in synchronism with clocks. However, in case of a cache miss, the practical bandwidth with respect to random access is considerably low. In other words, in a period between the times t1 and t2, the time when data is not read out, namely, the waiting time of the MPU, is long.

In the case of the SDRAM of the specification as shown in FIG. 1, the maximum bandwidth in the random access time is only 36% of that of the burst access time. It is highly possible that the slow access will be a bottleneck for further improvement of the performance of the computer system.

In consideration of the above situations, there has been an increased demand for a high-performance DRAM which realizes a higher access and a shorter cycle time. Particularly, in a multi MPU system such as a current high-performance server machine, not only high-speed burst transference but also high-speed random access is regarded as very important. Further, in a household multimedia system mainly for the purpose of real-time reproduction of an animation image in the future, there will be a demand for a similar DRAM that allows high-speed random access.

The DRAMs, which will meet such a demand, are an enhanced SDRAM (hereinafter referred to as an ESDRAM) as shown in FIG. 2 published by Enhanced Memory Systems Inc. and a virtual channel memory (hereinafter referred to as VCM) as shown in FIG. 3 published by NEC Corporation.

In the ESDRAM, however, each bank incorporates a SRAM cache 101, as shown in FIG. 2. In the VCM, 16 1K-caches 102 comprising register circuits are mounted. Thus, the DRAM of this kind has a great number of cache memories in addition to the conventional DRAM memory cell array. Since high-speed access and a short cycle are realized by many cache memories, overheads are high relative to the chip size. Therefore, it is difficult to lower the cost.

Both high-speed random access and low cost can be achieved by a method in which, the idea of "the page cycle" function, an operation mode of the conventional DRAM, is not used. According to this method, when a very little amount of cell data has been detected and amplified in the DRAM operation, a precharge operation is automatically stated immediately.

More specifically, as shown in FIG. 4, when a read command (RCMD#1) is issued at a time t1, activation of a word line (WL) is started and cell data is read out to a group of bit lines (bBL/BL). Thereafter, a sense amplifier is activated at a time t2. When cell data is detected by the sense amplifier, a column selection line (CSL) is activated at a time t3, and bit line data is transferred to a data line (not shown) in the chip and output through the data line to the outside of the chip. The sense amplifier amplifies the cell data to a desired voltage in a period of time in which data is transferred through the line between the data line and the read out section in the chip. When the amplification is completed at a time t4, a series of precharge operations, e.g., inactivation of the word line (WL) and precharge of the bit line, are automatically started. Thus, although the DRAM does not have a page access function, a series of access sequences can be completed in the minimum time, resulting in high-speed random access in a short cycle.

Further, an improved synchronous memory for improving the data transfer performance to the maximum has been devised. In the devised memory, a so-called read latency (R.L.), i.e., a time between setting of a read command and establishment of read data, is set t6 the same clock cycle value as that of a so-called write latency (W.L.), i.e., a time between setting of a write command and preparation of effective write data. A no bus latency SRAM (NoBL SRAM) proposed by Cypress Semiconductor Corporation is an example of such a memory.

The conventional pipeline SRAM requires a period of four clocks to realize a read/write mixed cycle, as shown in FIG. 5. On the other hand, as shown in FIG. 6, the NoBL SRAM requires two clocks, i.e., half the clocks required by the conventional art.

As described above, R.L. and W.L. are set to the same clock cycle value (two clock cycles in FIG. 6) in the NoBL SRAM. As a result, a data reading operation and a data writing operation can be executed without an unnecessary idle cycle, with the result that the data transfer performance can be improved.

When the above method for setting R.L. and W.L. to the same clock cycle value is applied to a DRAM, problems as described below will occur.

The DRAM is different from the SRAM in internal operation of the memory. In the DRAM, data must be read out from the sense amplifier after row operations for driving a word line (WL), driving a sense amplifier, etc., as shown in FIG. 4. In other words, reading of data from the memory cell of the DRAM requires a certain limited time after the row operations are completed, i.e., after cell data is detected and amplified by the sense amplifier. An example of the internal read operation is shown in FIG. 7. In FIG. 7, the internal timing of the read operation is illustrated in association with time.

In FIG. 7, it is assumed that a period of 10 ns is required after setting of the read command until the word line is activated and cell data is read out from the memory cell to the bit line (WL Activation: W.ACT.), a period of 5 ns is required to detect the cell data by the sense amplifier (Sensing: SENSE.), a period of 10 ns is required to amplify the cell data by the sense amplifier (Restore: RSTRE.), and a period of 5 ns is required for precharging (Equalize: EQL.). In this case, the cycle time of the DRAM is 30 ns.

As shown in FIG. 7, without the function of the page cycle, an operation of reading data from the DRAM can be performed parallel with amplification of cell data upon completion of detection of the sense amplifier. This is because precharging (EQL.) is started automatically upon completion of detection (SENSE.) and amplification (RSTRE.) of the cell data by the sense amplifier.

It is assumed that a period of about 8 ns is required to read the cell data out of the chip through the data line inside the chip (Data Transfer: D.TRS.). In this case, if the column selection line (CSL) is activated at the timing when the sense amplifier has completed detection of the cell data, a period (ACCESS TIME) of about 25 ns is required since the setting of the read command until the data is actually read out of the chip.

Assuming that the data is transferred to the data bus in synchronism with a rise of an external clock CLK, R.L. is 3 clock cycles as shown in FIG. 7 (this condition is defined as R.L.=3).

An operation of writing data to the DRAM will now be described. If W.L. is set to the value same as R.L., 3 cycles (W.L.=3), established write data is taken in the chip and transferred to the sense amplifier through a data line in the chip. However, as clear from FIG. 7, at the timing of the third clock from the setting of the write command, the DRAM is already in the precharge (EQL.) state. Therefore, it is impossible to write data in the memory cell.

This problem can be overcome by setting the time required before precharging in a write operation longer than the time required before precharging in a read operation. In other words, it is only necessary that the cycle time in the write operation be set longer than the cycle time in the read operation. However, to increase the cycle time in the write operation, the data transfer efficiency is considerably reduced in a read/write mixed cycle, with the result that the merit of a high-speed random accessing cycle DRAM is impaired.

As described above, in the DRAM in which a high-speed random access in a short cycle is realized by eliminating the function of the page cycle, the clock cycle values of the read latency (R.L.) and the write latency (W.L.) are different from each other. Therefore, it is difficult to improve the data transfer efficiency in operations of continuously writing or reading data in or from bits corresponding to different row addresses on the same page.

If the clock cycle values of the read latency (R.L.) and the write latency (W.L.) are the same, the cycle time in the write operation must be longer than that in the read operation, in order to prevent the DRAM from a precharging state when write data is input. Therefore, the data transfer efficiency cannot be improved.

BRIEF SUMMARY OF THE INVENTION

A semiconductor memory device according to a first aspect of the present invention comprises: a bit line; a memory cell coupled to the bit line; and a word line coupled to, the memory cell, wherein a first time between receiving a read command for a read operation in order to read data from the memory cell and beginning the read operation is different from a second time between receiving a write command for a write operation in order to write data to the memory cell and beginning the write operation.

A semiconductor memory device according to a second aspect of the present invention comprises: a memory cell array including memory cells; a command decoder which detects whether an input command is a write operation or a refresh operation; an address register which stores address information of a cell to be written to when the write operation has been detected; an input data register which stores write data information to be stored in the cell to be written to when the write operation has been detected; and a refresh controller which causes the data information stored in the input data register to be written to the memory cell array in accordance with the address information stored in the address register when the refresh operation is detected, and causes the refresh operation to be started after the writing.

DETAILED DESCRIPTION OF THE INVENTION

Embodiments of the present invention will be described with reference to the accompanying drawings.

Although the embodiments described below relate to a SDRAM which allows a highspeed random access cycle and does not have a page cycle function, the present invention is also applicable to a SDRAM having a page cycle function.

First Embodiment

Figure 1:
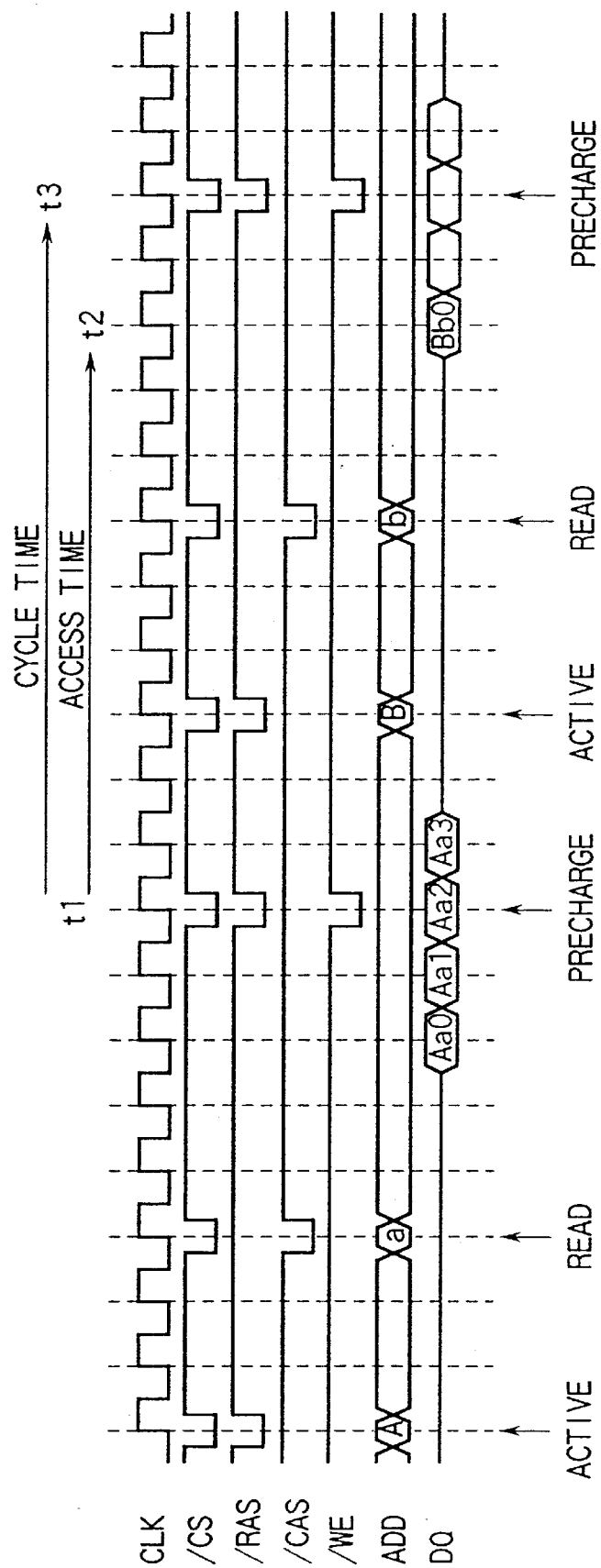
FIG. 1 is a waveform diagram illustrating operations of a conventional SDRAM.
Figure 2:
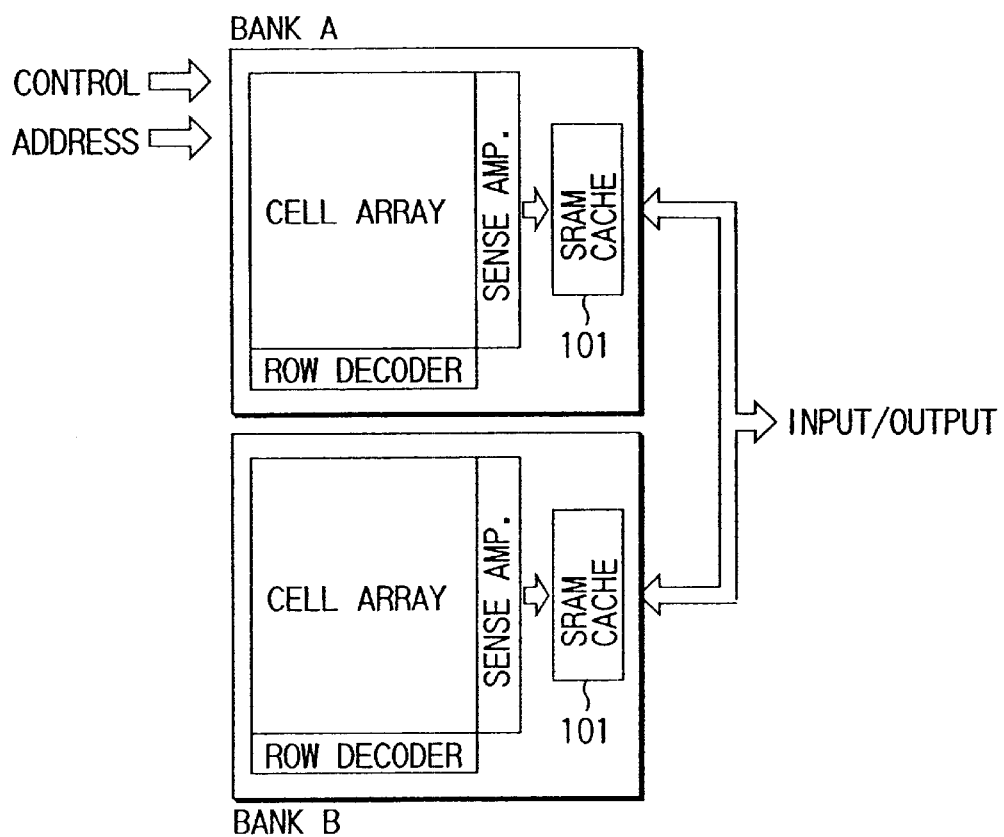
FIG. 2 is a block diagram of a conventional ESDRAM.
Figure 3:
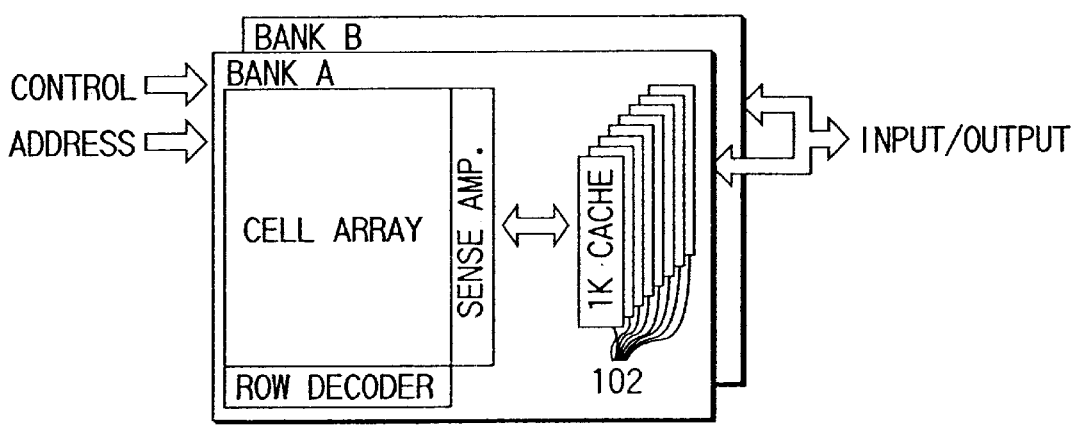
FIG. 3 is a block diagram of a conventional VCM.
Figure 4:
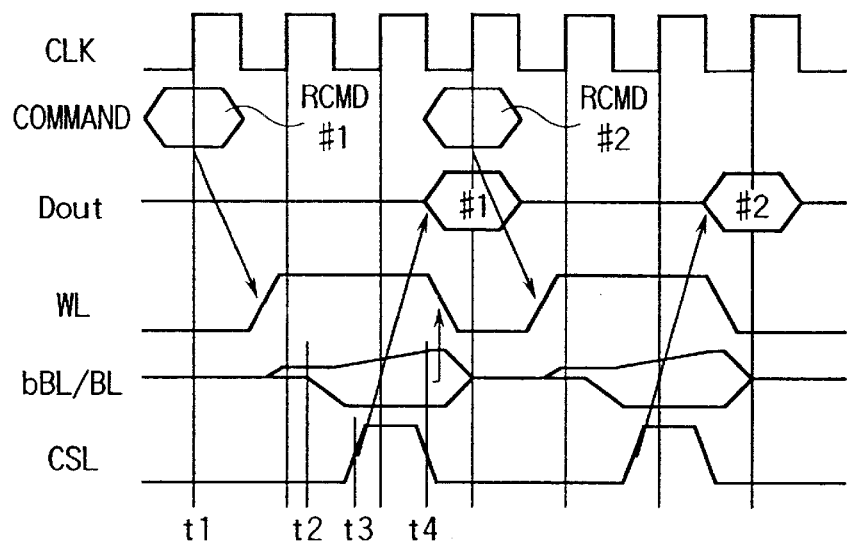
FIG. 4 is a waveform diagram illustrating operations of a DRAM in which the conventional page access function is not used.
Figure 5:
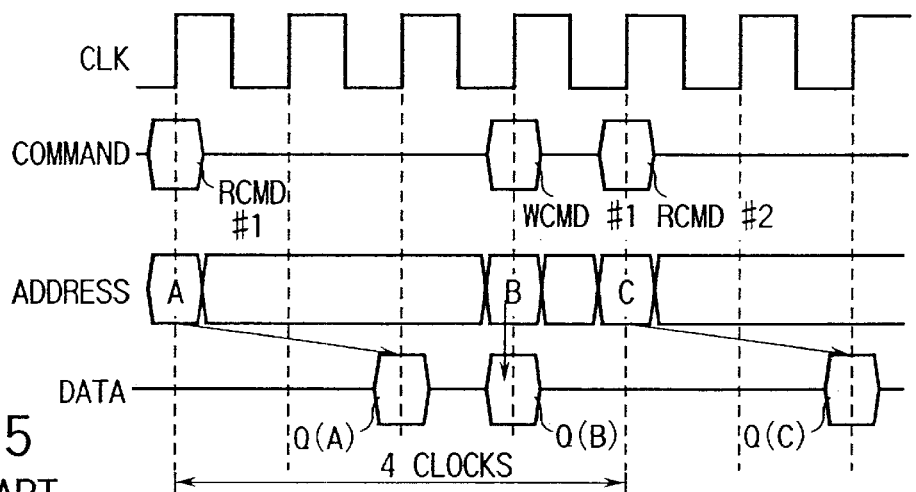
FIG. 5 is a waveform diagram illustrating operations of a conventional pipeline SRAM.
Figure 6:
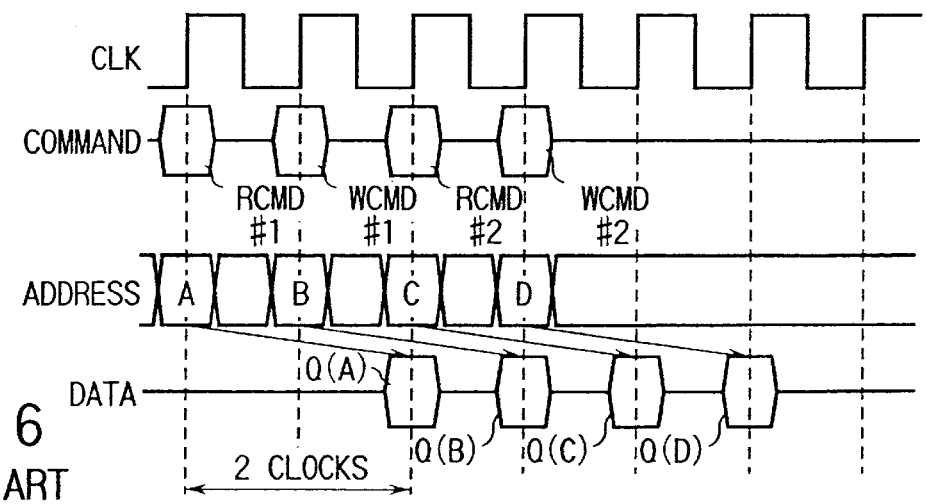
FIG. 6 is a waveform diagram illustrating operations of a conventional NoBL SRAM.
Figure 7:
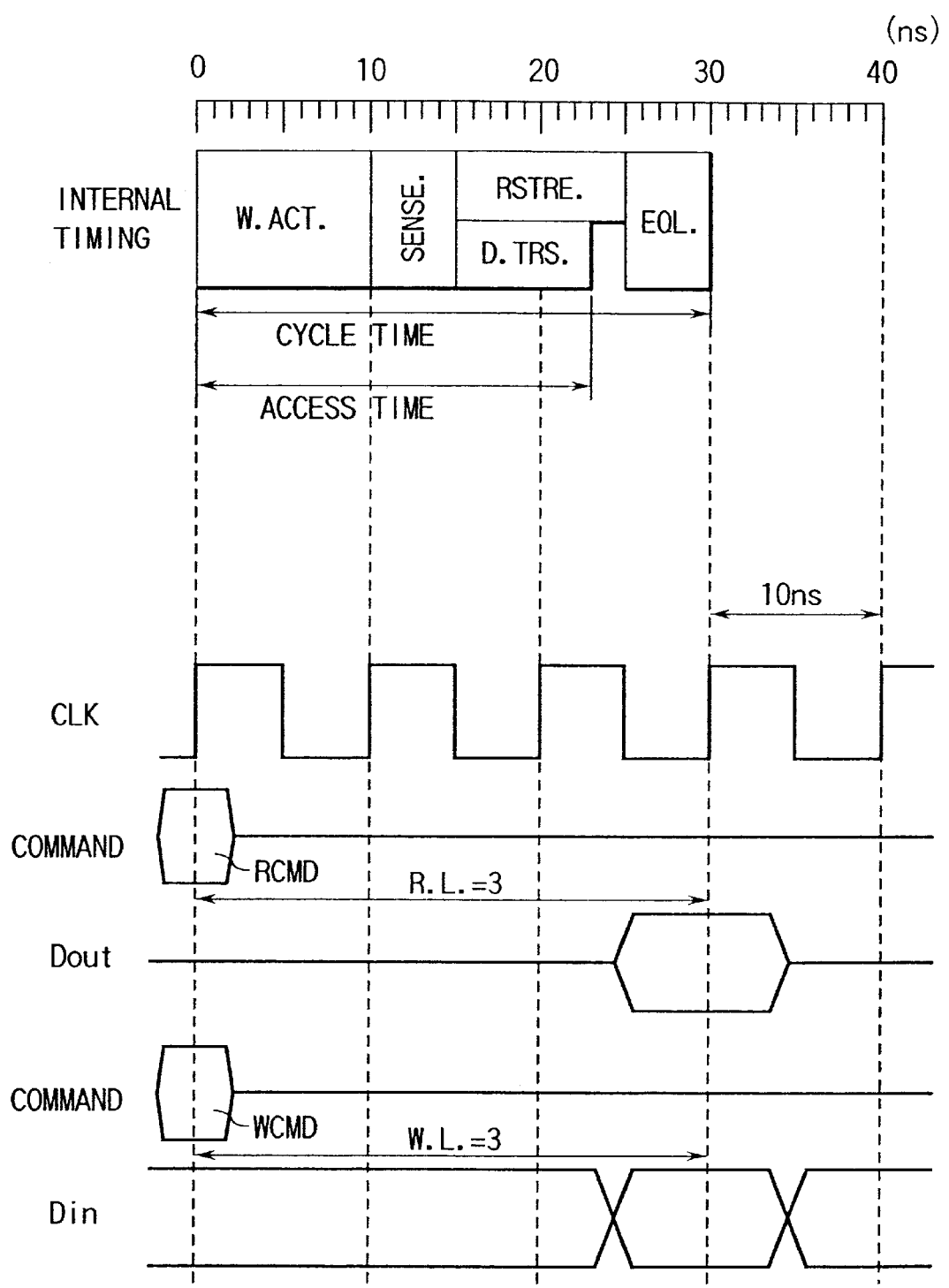
FIG. 7 is a diagram for explaining problems of the DRAM in which the conventional page access function is not used.
Figure 8A:
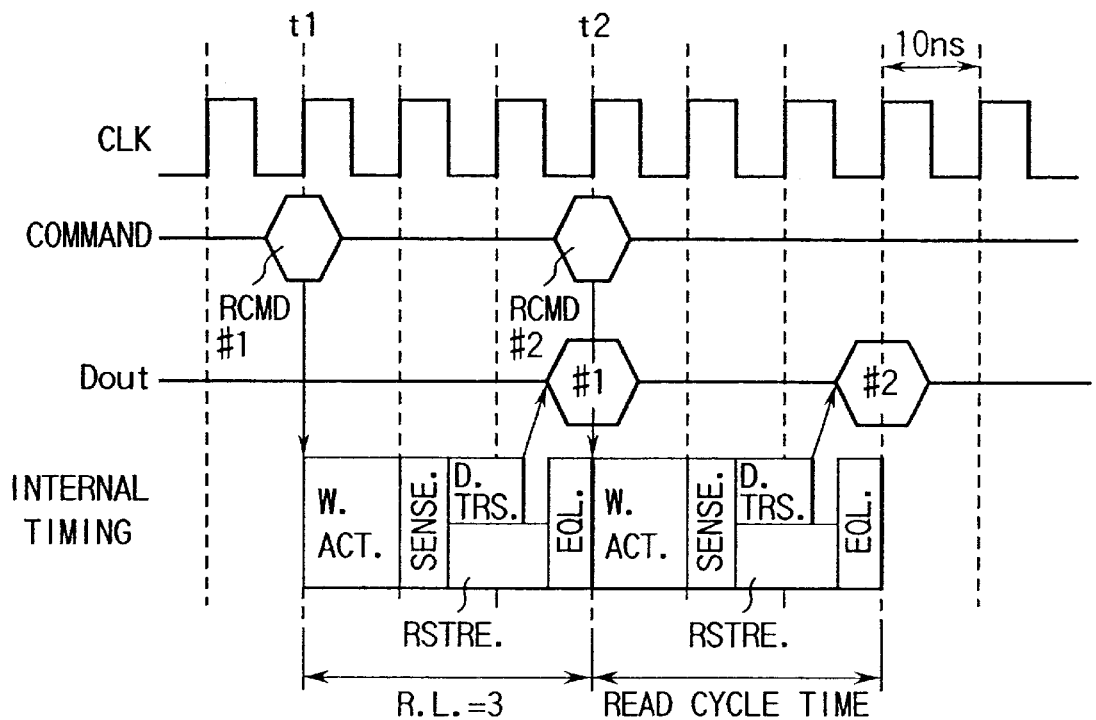
FIG. 8A is a waveform diagram illustrating continuous read operations of a DRAM according to a first embodiment of the present invention.
Figure 8B:
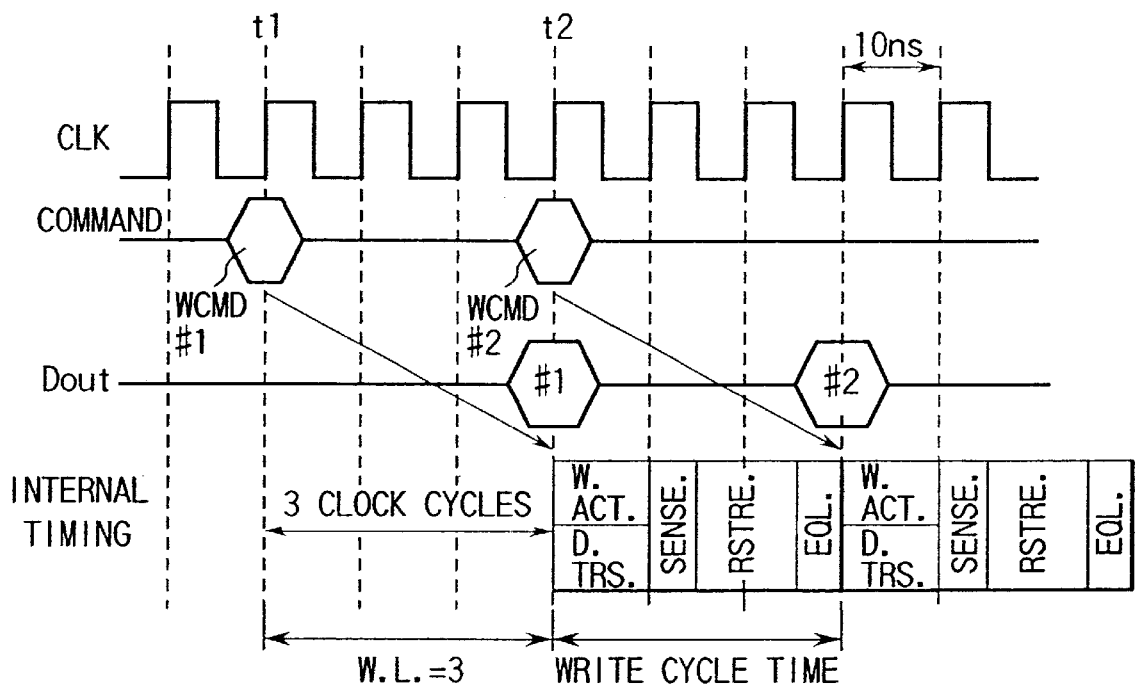
FIG. 8B is a waveform diagram illustrating continuous write operations of the DRAM according to the first embodiment of the present invention.

FIGS. 8A and 8B are waveform diagrams illustrating operations of an SDRAM according to a first embodiment of the present invention. It is assumed that the SDRAM is operated in synchronism with an external clock (CLK) having an operation frequency of 100 MHz. A read latency (R.L.), i.e., a delay time between setting of a read command and data output, is set to "3", and a write latency (W.L.), i.e., a delay time between setting of a write command and preparation of effective write data, is set to "3". Thus, both the latencies are set to the same clock cycle value.

The waveform diagrams of FIGS. 8A and 8B also show internal operation timings of the SDRAM. It is assumed that the SDRAM has the following five internal operation statuses.

(1) an operation, after setting of the read command, of activating a word line and electrically connecting a memory cell and a bit line (WL Activation (W.ACT.): activation of a word line);

(2) an operation of detecting data on the bit line by means of a sense amplifier (Sensing (SENSE.): detection of data);

(3) an operation of amplifying the data on the bit line by means of the sense amplifier (Restore (RSTRE.): amplification of data);

(4) an operation of inactivating the word line (WL) and precharging the bit line (Equalize (EQL.): precharge); and (5) an operation of reading the data from the bit line to the outside of the chip (Data Transfer (D.TRS.): transference of data).

Further, it is assumed that activation of the word line requires about 10 ns, detection of data requires about 5 ns, amplification of the data requires about 10 ns, precharging requires about 5 ns, and transference of the data requires about 8 ns.

On these assumptions, according to the basic specification of the SDRAM of the first embodiment, the time between the activation of the word like and the precharging, i.e., the cycle time of the DRAM, is about 30 ns. The time between the setting of a read command and an operation of reading the data from the bit line to the outside of the chip, i.e., the access time, is about 25 ns. The cycle time in the read operation (READ CYCLE TIME) and the cycle time in the write operation (WRITE CYCLE TIME) are both about 30 ns (=3 clock cycles).

An example of the aforementioned SDRAM, according to the first embodiment, will be described below.

FIG. 8A is a waveform diagram illustrating continuous read cycles.

As shown in FIG. 8A, if a read command (RCMD#1) is input to the chip in synchronism with an external clock CLK at a time t1, data is read out about 25 ns later. At the timing of R.L. =3, i.e., at a time t2, read data (#1) is established. Further, if a read command (RCMD#2) is input to the chip at the time t2, i.e., 30 ns from the time t1, the maximum data efficiency can be obtained.

FIG. 8B is a waveform diagram illustrating continuous write cycles.

As shown in FIG. 8B, in the case of continuous write cycles, a write command (WCMD#1) is input to the chip at the time t1, and write data (#1) is input to the chip at the time t2 (W.L. =3).

The key point of the present invention is that the internal operation of the DRAM has the following characteristic: the start time of the internal write operation of the DRAM is set later than the start time of the internal read operation, so that the write data (#1) can be completely written in the memory cell.

For example, as shown in FIG. 8B, activation of the word line (WL) is started at the time t2, i.e., 3 clocks later than the time t1 when the write command (WCMD#1) is input (start of an operation of accessing the memory section). Thus, the timing of transferring write data to the sense amplifier section through the data bus inside the chip is rendered substantially coincide with the timing of completion of the activation of the word line (WL) of the memory cell corresponding to the address to which data is to be written. Therefore, external data can be written without fail into the memory cell corresponding to the address to be written, parallel to rewriting (detection and amplification) of data to a memory cell connected to the word line (WL) and corresponding to an address other than that of the memory cell to be written.

Thus, in the write operation also, another write command (WCMD#2) can be input to the chip at the time t2, 30 ns later than the time t1, as in the read operation. As a result, the maximum data transfer performance both in the continuous read and write operations can be set to the same.

As described above, the start time of the internal operation of the DRAM in the write operation is set at least 1 clock cycle (3 clock cycles in FIG. 8B) later than the start time of the internal operation in the read operation of the DRAM. With this characteristic, the data transfer performance can be set to the maximum both in the continuous read and write cycles.

Accordingly, in the SDRAM capable of reading data from the memory cell in response to the read command and writing data into the memory cell in response to the write command, even if R.L. and W.L. are set to the same clock cycle, improved data transfer performance can be obtained without contradiction in the internal operation of the DRAM, that is, without a condition that the DRAM is precharged when write data is input.

In this embodiment, the start time of the internal operation of the DRAM in the write operation is set 3 clock cycles (30 ns) later than the start time of the internal operation in the read operation of the DRAM. However, the time can be changed suitably depending on the frequency of the external clock and the operation speed performance of the DRAM.

Second Embodiment

As described above, according to the first embodiment, the start time of the internal operation of the DRAM in the write operation is set later than the start time of the internal operation in the read operation of the DRAM, so that W.L. and R.L. can be set to the same clock cycle value.

However, in a read/write mixed cycle, an unnecessary idle cycle occurs in a period between commands. This phenomenon will be described with reference to FIG. 9.

Figure 9:
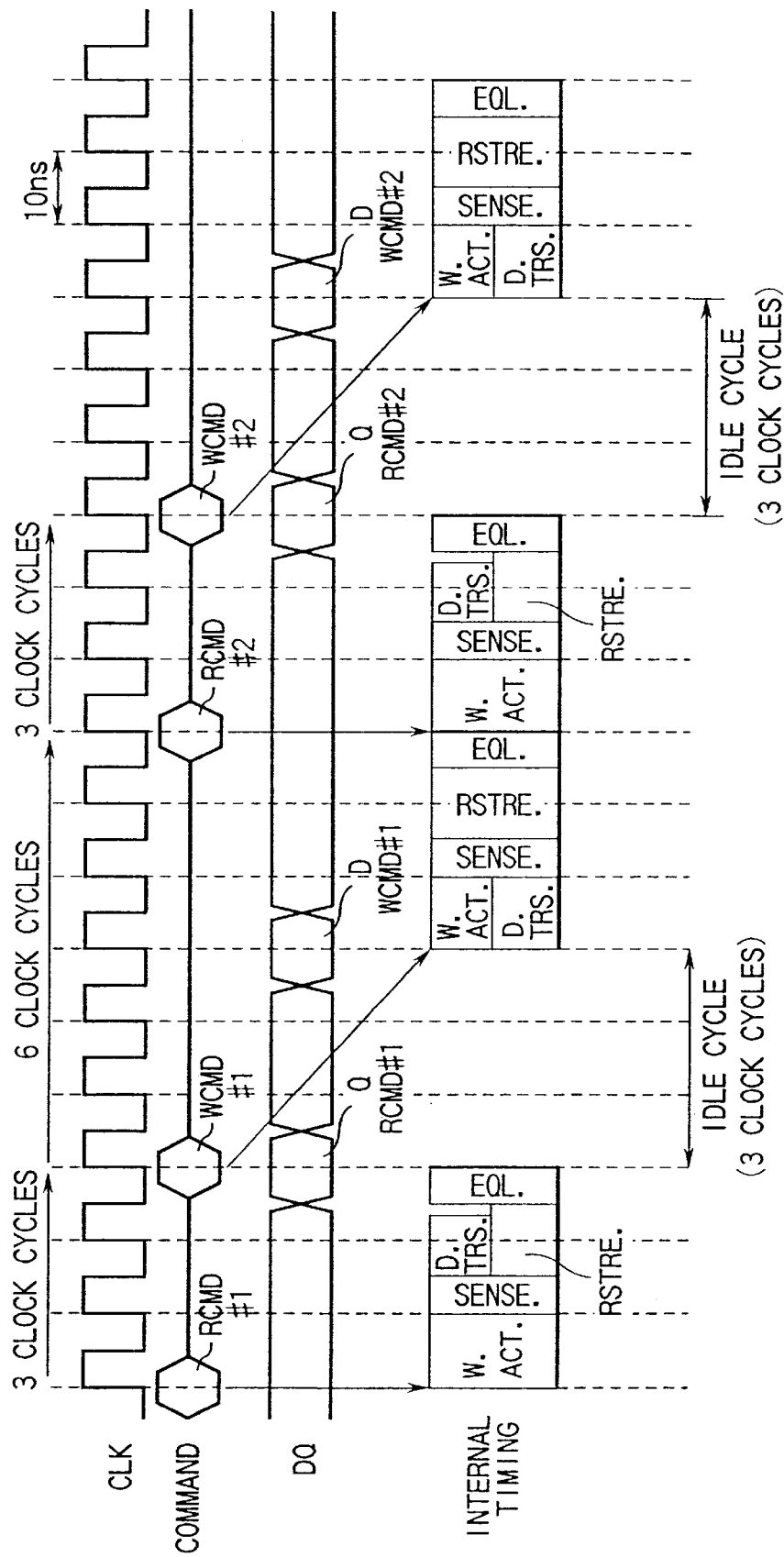
FIG. 9 is a waveform diagram illustrating a read/write mixed cycle of the DRAM according to the first embodiment of the present invention.

FIG. 9 shows an access sequence of continuous operations of read, write, read, write, In this case, a command can be input in an interval (3clock cycles) determined by the cycle time of the DRAM when the read operation is shifted to a write operation. However, when the write operation is shifted to a read operation, an interval of 6 clock cycles is required. Thus, an idle cycle of three clocks occurs. This is because the start time of the internal operation of the DRAM in the write operation is set 3 clocks later than the start time of the internal operation in the read operation, and completion of the write operation inevitably delays, with the result that the write operation cannot be shifted to a read operation. FIG. 9 shows this state as an internal operation timing of the DRAM.

In the DRAM in which R.L. and W.L. are set to the same clock cycle value for the purpose of improving the data bus efficiency, an idle cycle is present in a read cycle immediately after a write cycle. If the idle cycle, i.e., the interval between the write command and the subsequent read command is shortened, the data transfer performance of the DRAM of this invention can be further improved.

An object of the second embodiment is to reduce the interval between the write command and the read command, thereby further improving the data transfer performance of the DRAM.

Figure 10:
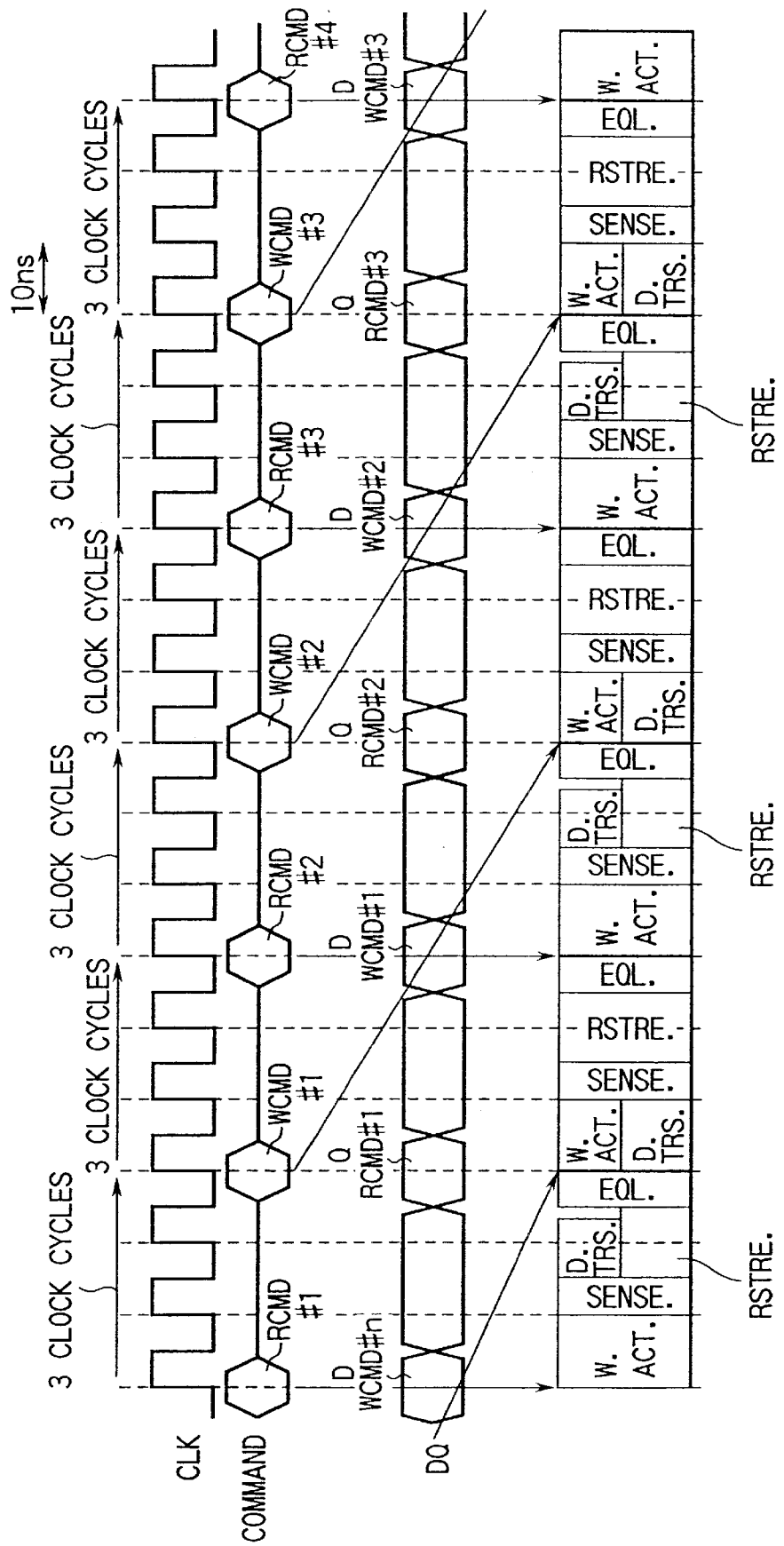
FIG. 10 is a waveform diagram illustrating a read/write mixed cycle of a DRAM according to a second embodiment of the present invention.

FIG. 10 is a waveform diagram illustrating a high-speed random accessing cycle DRAM according to the second embodiment.

As shown in FIG. 10, an idle cycle does not occur between a write cycle and a read cycle even in the read/write continuous cycles. This is because, an operation of actually writing data into a memory cell in the DRAM is started at the timing when the next write command is set, as shown in FIG. 10 as the internal operation timing of the DRAM. For example, an operation of writing data in the DRAM set by a first write command (WCMD#1) is started at the timing when a second write command (WCMD#2) is set.

If subsequent operations of actually writing data into the DRAM are set so as to start at the timings when the next write commands are set, even in the case of an access sequence of continuous read and write operations, an unnecessary idle cycle does not occur. As a result, in the DRAM which does not have a page cycle function, even in the case where R.L. and W.L. are set to the same clock cycle value (3 in this case) for the purpose of improving the data bus efficiency, the idle cycle can be eliminated without contradiction in the internal operation of the DRAM.

It is possible to set, separately from the normal write operation, the above operation of starting the internal write operation in the DRAM at the timing when the next write command is set. In other words, it is possible to set two kinds of write mode. In this case, the write operation according to the second embodiment is called "a delayed write operation" distinct from "a normal write operation". The two write operations can be set freely on the side of the system by means of control pins of the DRAM.

Figure 11:
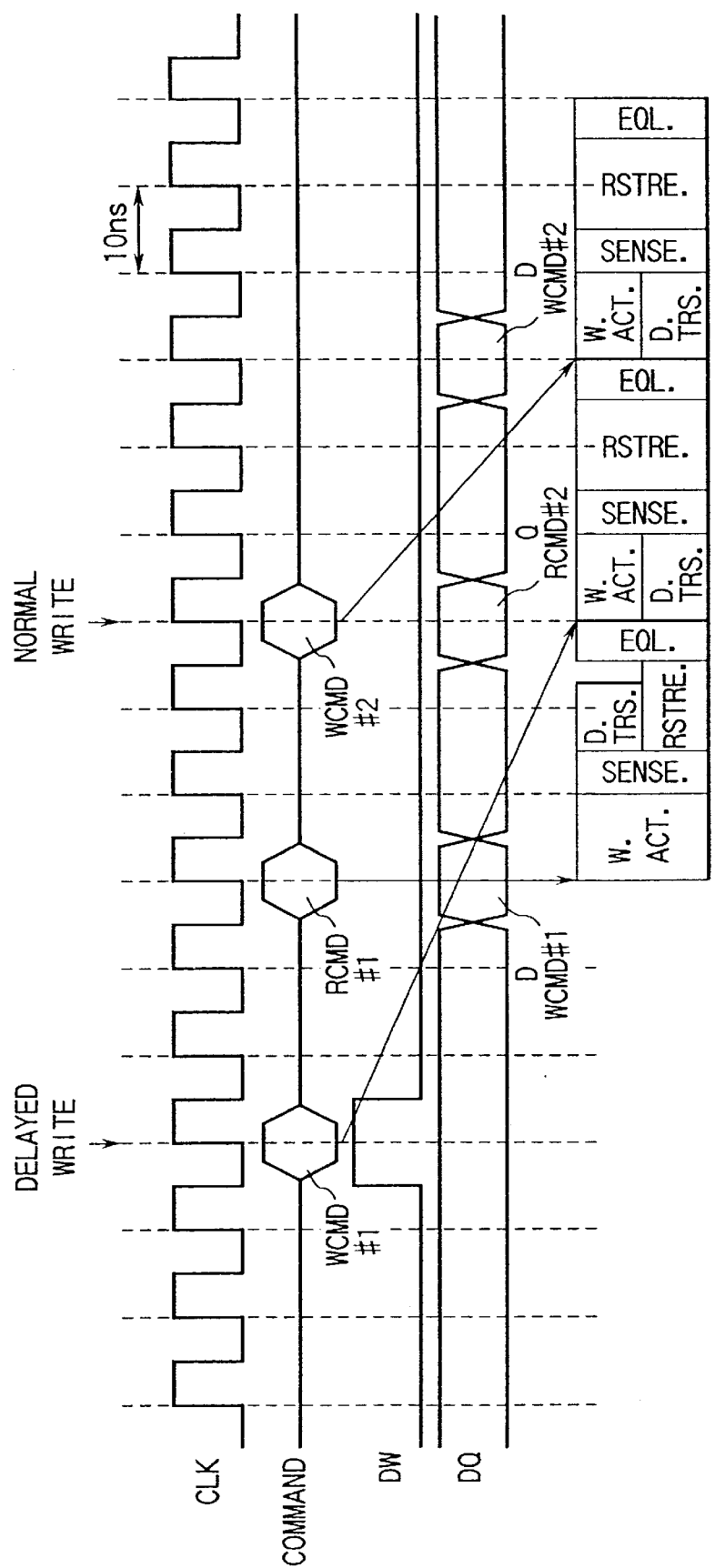
FIG. 11 is another waveform diagram illustrating a read/write mixed cycle of the DRAM according to the second embodiment of the present invention.

FIG. 11 shows an example of the operation timing in the case where a read/write mixed cycle is realized by the two kinds of write operation.

In the example shown in FIG. 11, a control signal DW (Delayed Write: DW) is input to an exclusive access control pin in order to discriminate "the normal write operation" and "the delayed write operation".

In this case, it is assumed that "the delayed write operation" is set when the control signal DW is set to the "HIGH" level in a cycle when the write command is set.

As shown in the internal operation timing of the DRAM in FIG. 11, the first write command (WCMD#1) is set to "the delayed write operation", the read command (RCMD#1) follows, and thereafter, the second write command (WCMD#2) is set to "the normal write operation". Even in this case, two write operations and one read operation can be performed without contradiction of the internal operation of the DRAM. This is clear from the fact that the operation of the DRAM is determined definitively, that is, the operations of the DRAM do not overlap each other at any timings in the internal operation timing shown in FIG. 11.

To prevent the DRAM from a precharged state when write data is input, the start time of the normal write operation is set 3 clock cycles later than the start time of the read operation, as in the first embodiment described above. A write operation can be completed in 3 clock cycles, if the previous write operation is "the delayed write operation". In other words, it is indispensable for "the delayed write operation" that the starting point of the internal operation is delayed at least the cycle time required for operating the DRAM.

In this embodiment, a control signal DW is input to the exclusive access control pin in order to discriminate "the normal write operation" and "the delayed write operation". However, the present invention is achieved by not only this means but other various means. For example, either "the normal write operation" or "the delayed write operation" can be designated by a condition of a specific pin, a combination of a plurality of pins, or a mode register setting cycle as used in the general SDRAM.

Figure 12:
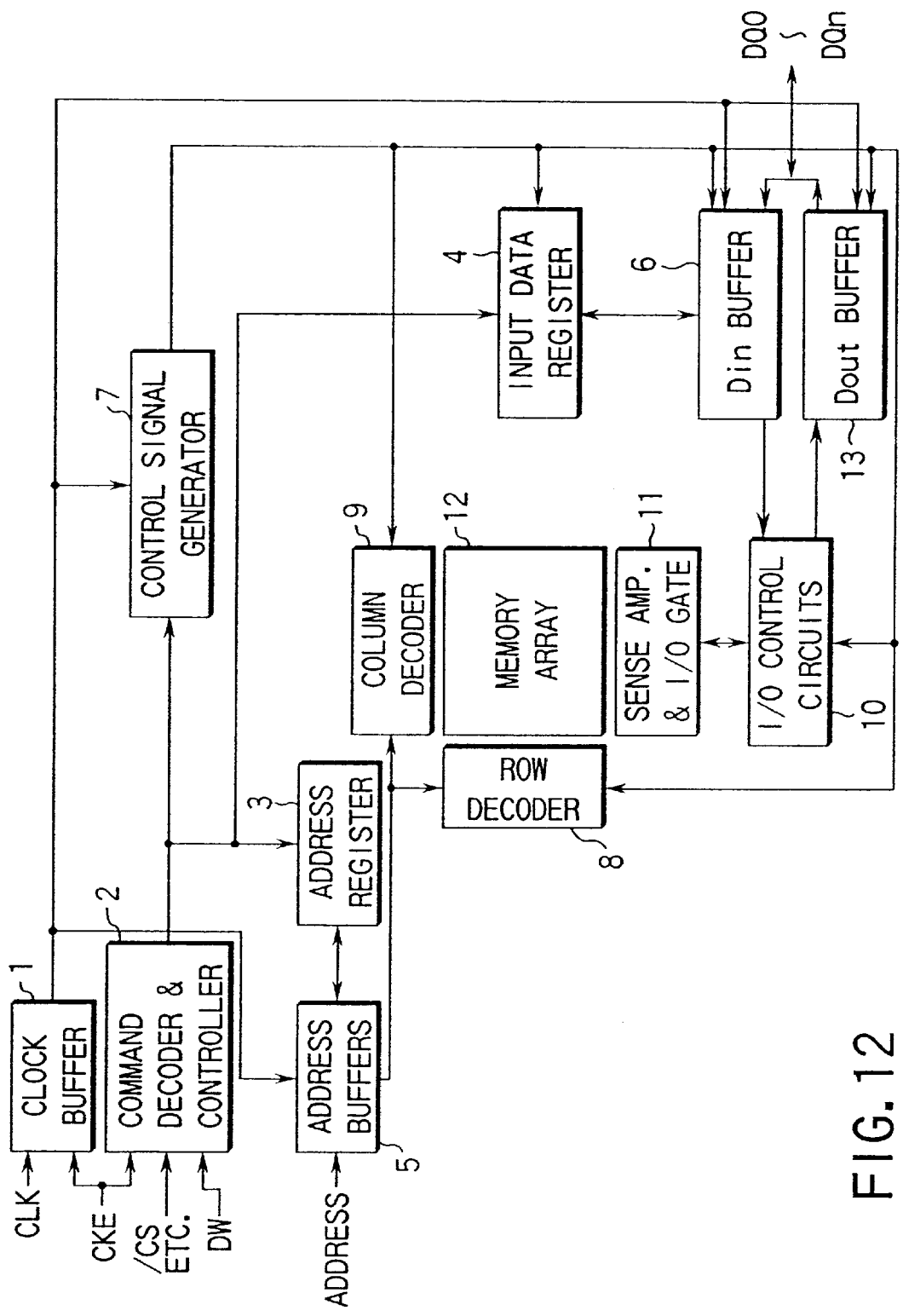
FIG. 12 is a block diagram of the DRAM according to the second embodiment of the present invention.

FIG. 12 is a block diagram schematically showing the DRAM according to the second embodiment of the present invention.

As shown in FIG. 12, an external input clock (CLK), serving as a reference of all operation timings, is input to a clock buffer 1, and thereafter to main blocks to determine operation timings of the blocks. In this embodiment, after the external input clock (CLK) is input to the clock buffer, it is input to address buffers 5, a data input buffer (Din BUFFER) 6, a control signal generator 7 and a data output buffer (Dout BUFFER) 13.

A command designating clock group (/CS etc.) including a chip select signal (/CS) is input to a command decoder and controller 2. The command decoder and controller 2 decodes various commands, and controls the internal operations of the DRAM in accordance with the decoded results. In the case where a control signal DW is input as in this embodiment, it is input to the command decoder and controller 2. As a result, the command decoder and controller 2 discriminates "the normal write operation" and "the delayed write operation", and either write operation is designated inside the DRAM.

If "the delayed write operation" is designated, the command decoder and controller 2 activates an address register 3 and an input data register 4. The address register 3 is connected to the address buffers 5 to which an external address is input. The input data register 4 is connected to an output of the data input buffer (Din BUFFER) 6 to which write data is input through data pins (DQ0–DQn). When the address register 3 is activated, it is operated to store address information of a cell which is subjected to the delayed write operation. When the input data register 4 is activated, it is operated to store write data information of the subject cell.

Further, the command decoder and controller 2 controls the control signal generator 7, so that the operation start timings, different in the normal write operation, the delayed write operation and the read operation, can be determined in synchronism with a timing of the external input clock (CLK). The control signal generator 7 determines operation timings of a row decoder 8, a column decoder 9 and an I/O control circuit 10, which are included in a core circuit portion of the DRAM.

In "the normal write operation", write data input to the data input buffer 6 through the data pin (DQ0–DQn) is written in a memory cell (not shown) in a memory cell array 12 through the I/O control circuit 10 and an I/O gate and sense amplifier (SENSE AMP. & I/O GATE) 11.

In "the delayed write operation", the write data stored in the input data register 4 is written in a memory cell (not shown) in a memory cell array 12 through the I/O control circuit 10 and the I/O gate and sense amplifier (SENSE AMP. & I/0 GATE) 11, as in "the normal write operation".

In "the write operation", information stored in a memory cell (not shown) is read out to the data pin (DQ0–DQn) through the I/O gate and sense amplifier 11, the I/O control circuit 10, and the data output buffer 13.

Examples of the command decoder and controller 2 to realize the second embodiment will be described.

Figure 13A:
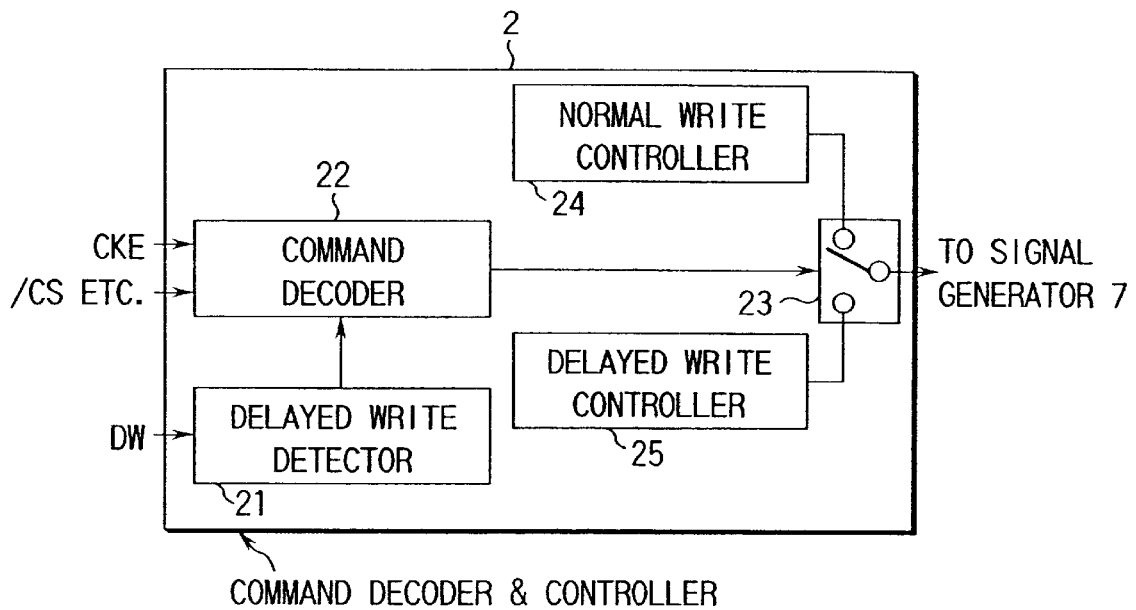
FIG. 13A is a block diagram of an example of the command decoder and controller shown in FIG. 12.

FIG. 13A is a block diagram schematically showing a first example of the command decoder and controller 2. FIG. 13A shows only a connecting portion of the command decoder and controller 2 that is connected to the control signal generator 7.

As shown in FIG. 13A, the first example includes a delayed write detector 21, a command decoder 22, a switch 23, a normal write controller 24 and a delayed write controller 25.

The delayed write detector 21, upon receipt of the control signal DW, detects whether the control signal means "the delayed write operation" or "the normal write operation", depending on the level of the signal, "HIGH" or "LOW". The result of the detection is transmitted to the command decoder 22.

The command decoder 22, upon receipt of the command designating clock group (/CS etc.), decodes the input command and determines, for example, "WRITE" or "READ". In the first example, when the command decoder 22 determines "WRITE", it further determines "the delayed write operation" or "the normal write operation" based on the result of detection transmitted from the delayed write detector 21. Based on the result of determination, the command decoder 22 controls a switch 23.

In the case of "the normal write operation", the switch 23 connects the normal write controller 24 to the control signal generator 7. As a result, the control signal generator 7 is controlled by an output from the normal write controller 24.

In the case of "the delayed write operation", the switch 23 connects the delayed write controller 25, instead of the normal write controller 24, to the control signal generator 7. As a result, the control signal generator 7 is controlled by an output from the delayed write controller 25.

Figure 13B:
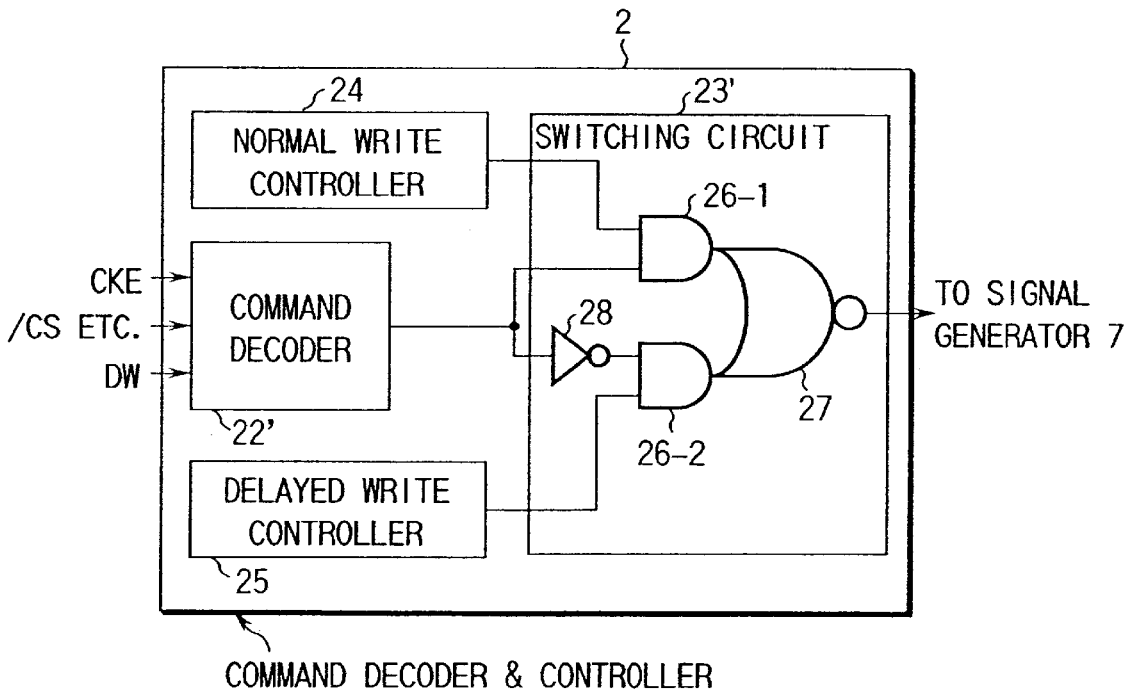
FIG. 13B is a block diagram of another example of the command decoder and controller.

FIG. 13B is a block diagram schematically showing a second example of the command decoder and controller 2. As well as FIG. 13A, FIG. 13B shows only a connecting portion of the command decoder and controller 2 that is connected to the control signal generator 7.

As shown in FIG. 13B, the second example includes a command decoder 22', a switch circuit 23', a normal write controller 24 and a delayed write controller 25.

The second example is different from the first example in that the control signal DW is input to the command decoder 22'. Therefore, a command combination of the control signal DW and the command designating clock groups (/CS etc.) is input to the command decoder 22'. The command decoder 22' decodes the input command.

The switch circuit 23' of the second examples is an example of the switch 23.

For example, the switch circuit 23' comprises a plurality of logical circuits. FIG. 13B shows a circuit configuration of the switch circuit 23'.

As shown in FIG. 13B, the switch circuit 23' comprises an AND circuit 26-1 for controlling whether to activate an output from the normal write controller 24, an AND circuit 26-2 for controlling whether to activate an output from the delayed write controller 25, and a NOR circuit 27 for outputting a logical OR of outputs from the two AND circuits 26-1 and 26-2.

In "the normal write operation", the command decoder 22'outputs a "HIGH level" output. The "HIGH level" output is input to the AND circuit 26-1. As a result, the AND circuit 26-1 is activated and an output level thereof is varied in accordance with the output level of the normal write controller 24. Consequently, the output of the normal write controller 24 is active.

The output of the command decoder 22'is inverted by an inverter 28 to a "LOW level" output, which is input to the AND circuit 26-2. Therefore, contrary to the AND circuit 26-1, the AND circuit 26-2 is inactive. Thus, the output level of the AND circuit 26-2 is fixed to the "LOW level", regardless of the output level of the delayed write controller 25.

The NOR circuit 27 is activated upon receipt of the "LOW level" output from the AND circuit 26-2, and an output level thereof is varied in accordance with the output level of the AND circuit 26-1. As a result, the output from the normal write controller 24 is input to the e control signal generator 7. Consequently, the control signal generator 7 is controlled by the output from the normal write controller 24.

In "the delayed write operation", the command decoder 22'outputs a "LOW level" output. Therefore, contrary to "the normal write operation", the AND circuit 26-1 is inactive. Thus, the output level of the AND circuit 26-1 is fixed to the "LOW level", regardless of the output level of the normal write controller 24. The AND circuit 26-2 is activated and an output level thereof is varied in accordance with the output level of the delayed write controller 25. Consequently, the output of the delayed write controller 25 is active.

The NOR circuit 27 is activated upon receipt of the "LOW level" output from the AND circuit 26-1, and an output level thereof is varied in accordance with the output level of the AND circuit 26-2. As a result, the output from the delayed write controller 25 is input to the control signal generator 7. Consequently, the control signal generator 7 is controlled by the output from the delayed write controller 25.

By the constitution as shown in FIG. 13A or 13B, the command decoder and controller 2 can discriminates "the normal write operation" and "the delayed write operation". In addition, in "the normal write operation", the output from the normal write controller 24 is input to the control signal generator 7, whereas in "the delayed write operation", the output from the delayed write controller 25 is input to the control signal generator 7. Thus, either "the normal write operation" or "the delayed write operation" can be designated in the DRAM.

Third Embodiment

A third embodiment relates to a method for controlling "the delayed write operation" other than the second embodiment.

In the second embodiment, the operation of actually writing data to a memory cell, corresponding to the address to which "the delayed write operation" is designated, is started at the timing when the next write command is set. Thus, high-speed continuous read/write mixed cycles can be realized without an idle cycle. However, a read command for reading data from the memory cell corresponding to the address may be set immediately after "the delayed write operation" is set.

Figure 14:
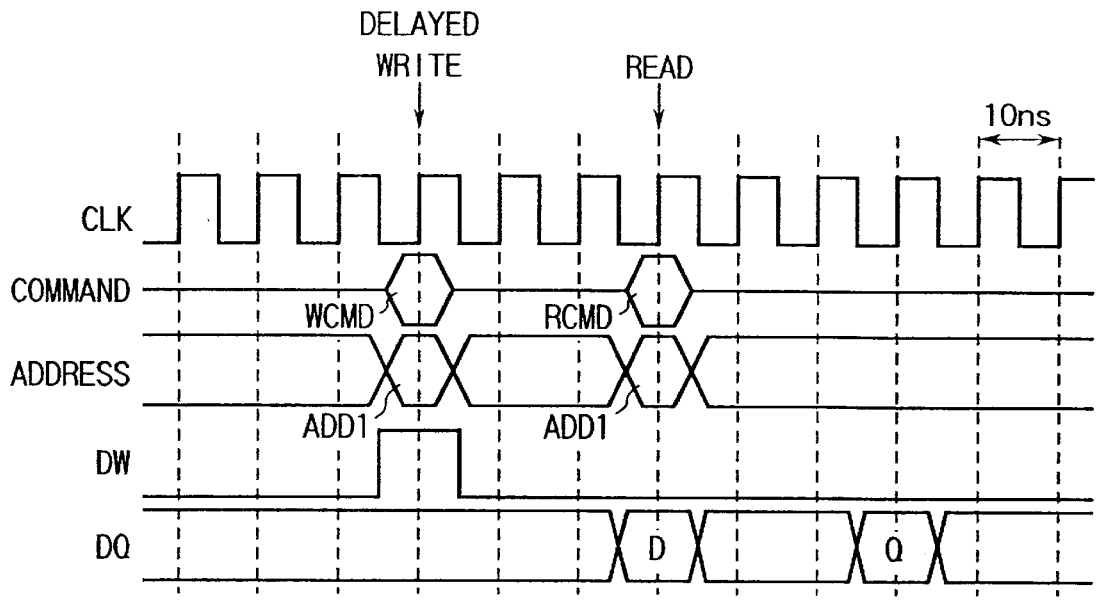
FIG. 14 is still another waveform diagram illustrating a read/write mixed cycle of the DRAM according to the second embodiment of the present invention.

FIG. 14 shows operation timings of the access sequence of the case where a write command (RCMD) for an address (ADD1) is input immediately after a delayed write command (WCMD) for the same address is input. In this case, no information is written in the memory cell corresponding to the address to which "the delayed write operation" is designated. Therefore, if information in the memory cell is to be rewritten in the delayed write operation, coherency of data cannot be maintained. In other words, since the data is not actually written in the memory cell, the data previously written is read out.

An object of the third embodiment is to read data which has not actually been written in a memory cell.

To achieve this object, according to the third embodiment, when data has not been written in a memory cell requested to be read, data read out not from the memory cell but from the input data register 4 storing data to be written into the memory cell. Thus, the coherency of the data can be maintained.

Figure 15:
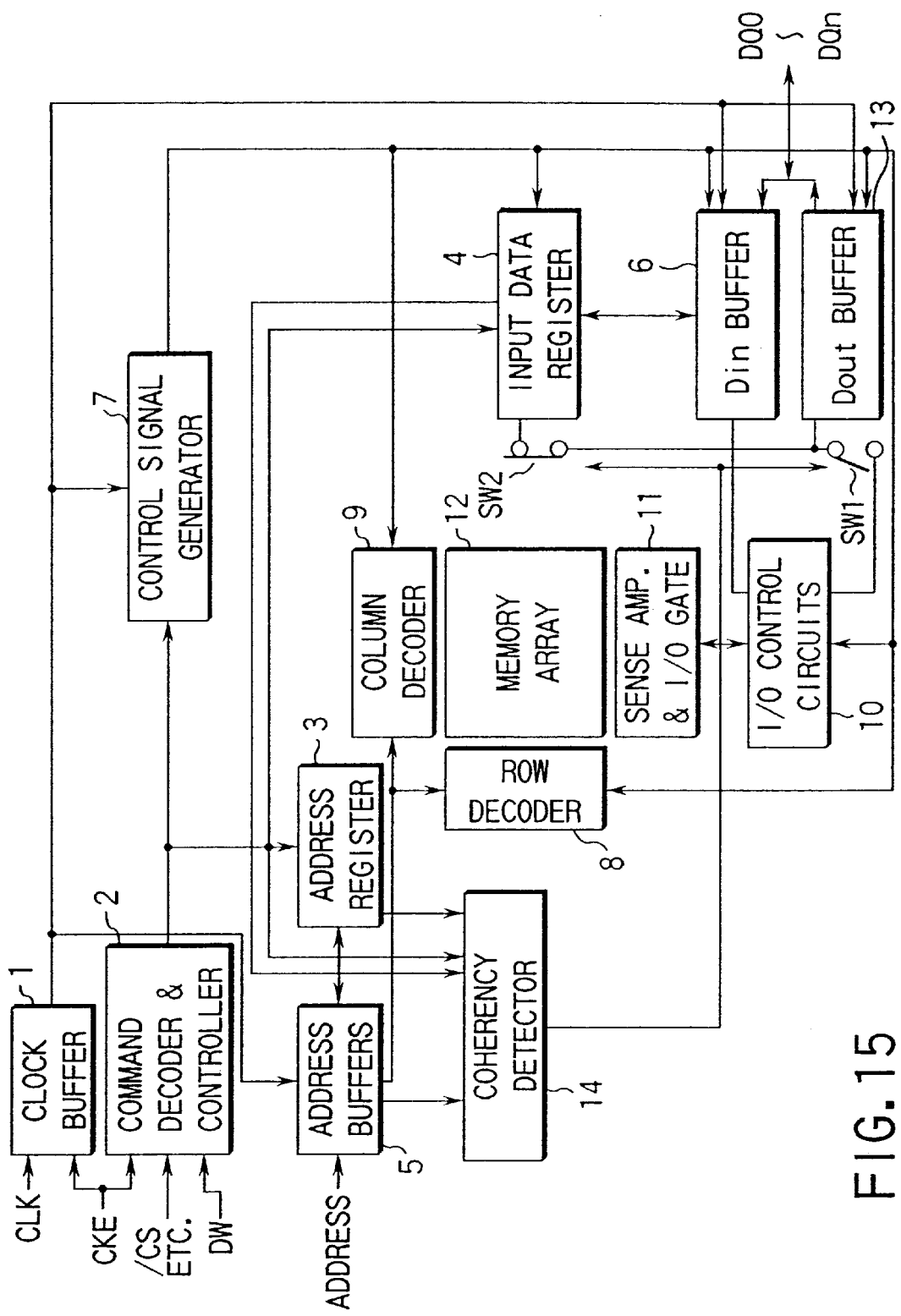
FIG. 15 is a block diagram of a DRAM according to a third embodiment of the present invention.

FIG. 15 is a block diagram schematically showing a DRAM according to the third embodiment.

As clear from FIG. 15, the DRAM of the third embodiment is different from the DRAM shown in FIG. 12 particularly in that a coherency detector 14 and switches (SW1, SW2) for cutting a read path from a memory cell are additionally provided.

When the read command is decoded by the command decoder and controller 2, the coherency detector 14 determines whether "the delayed write operation" is set before the present command cycle. Thereafter, it compares the address output from the address buffers 5 with the address output from the address register 3, and determines whether the command requests that data in the address subjected to "the delayed write operation" is to be read. If the result of determination is "TRUE", that is, if "the delayed write operation" is set and the address of the memory cell subjected to the delayed write operation coincides with the address of the memory cell subjected to the read operation, the coherency detector 14 turns off the switch (SW1) between the I/O control circuit 10 and the data output buffer 13 and turns on the switch (SW2) between the input data register 4 and the data output buffer 13. As a result, the path for reading data from the memory cell is cut and the path for reading data from the input data register 4 is turned on, so that the data is read out from the input data register 4. Data stored in the input data register 4 is data which should be written into the memory cell requested to be read. Therefore, it is possible to solve the problem of data incoherency that data which should have been written is not read out but previously written data is read out.

A structure of the coherency detector 14 for realizing the third embodiment will now be described.

Figure 16A:
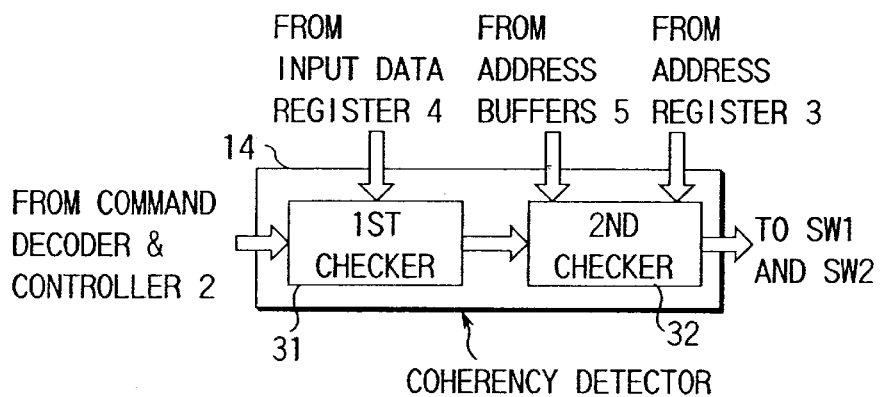
FIG. 16A is a block diagram of an example of the coherency detector shown in FIG. 15.

FIG. 16A is a block diagram schematically showing a first example of the coherency detector 14.

As shown in FIG. 16A, the first example includes a first checker 31 and a second checker 32.

The first checker 31 checks whether the input data register 4 has information unwritten in the memory cell. The second checker 32 checks whether the information in the address register 3 storing address information subjected to "the delayed write operation" coincides with the externally input address.

If the first checker 31 determines that "the input data register 4 stores information", this means that "the delayed write operation" has been set before the cycle when the read command is input. Therefore, the first checker 31 outputs information "TRUE".

If the second checker 32 determines that the information in the address register 3 coincides with the externally input address, this means that the memory cell to which data is to be written coincides with the memory cell from which data is to be read out. Therefore, the second checker 32 outputs information "TRUE".

If both the first and second checkers 31 and 32 output information "TRUE" as described above, the coherency detector 14 turns off the switch (SW1) and turns on the switch (SW2). As a result, the path for reading data from the memory cell is cut and the path for reading data from the input data register 4 is opened, so that the data is read out from the input data register 4.

Figure 16B:
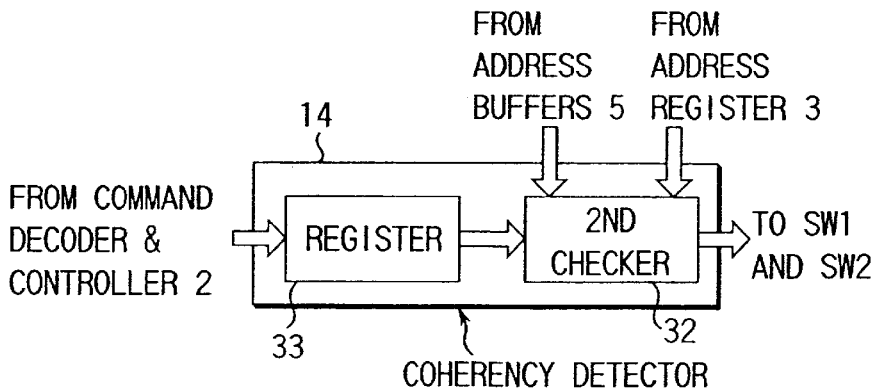
FIG. 16B is a block diagram of another example of the coherency detector.

FIG. 16B is a block diagram schematically showing a second example of the coherency detector 14.

As shown in FIG. 16B, the second example is different from the first example in that a register circuit (REGISTER) 33 is provided in place of the first checker 31. With this structure, a signal input form the input data register 4 can be omitted.

For example, the register circuit 33 for omitting a signal input from the input data register 4 is operated so as to be set in the case where "the delayed write operation" is set, and reset in the case where "the normal write operation" is set.

Upon receipt of an output from the register 33, the second checker 32 checks whether the information in the address register 3 storing address information subjected to "the delayed write operation" coincides with the externally input address.

If the second checker 32 outputs information "TRUE" as described above, the coherency detector 14 turns off the switch (SW1) and turns on the switch (SW2), as in the first example.

The function of the register which is set or reset in "the delayed write operation" or "the normal write operation" may be incorporated in the command decoder and controller 2. In this case, the coherency detector 14 may comprise only the second checker 32. Thus, the coherency detector 14 can be simplified.

Fourth Embodiment

A fourth embodiment is an auxiliary method for controlling the delayed write operation of the third embodiment.

In the third embodiment, the data coherency can be maintained by closing the path for reading data from the memory cell and opening the path for reading data from the data input register. With this operation, for example, the data coherency can be maintained in the case where the computer system is stopped. More specifically, when the computer system is stopped, necessary information in the memory is stored a non-volatile memory device of a large capacity, such as a hard disk device. Thereafter, the power source is turned off. In this case also, a read command is transmitted to the memory. At this time, it is possible that an operation of writing data into the memory cell is not completed, while the delayed write operation is being performed. However, the coherency detector 14 allows the data coherency to be maintained by closing the path for reading data from the memory cell and opening the path for reading data from the data input register.

However, in a portable information apparatus or the like, the use of the system may be temporarily stopped, while information in the main memory is not read out to an external non-volatile memory medium. More specifically, the information in the main memory, the DRAM, is maintained by a refresh operation, while the power sources of the external memory device, the MPU, the character information display device, etc., are turned off. This is called the resume function. The fourth embodiment is also effective in this function.

Figure 17:
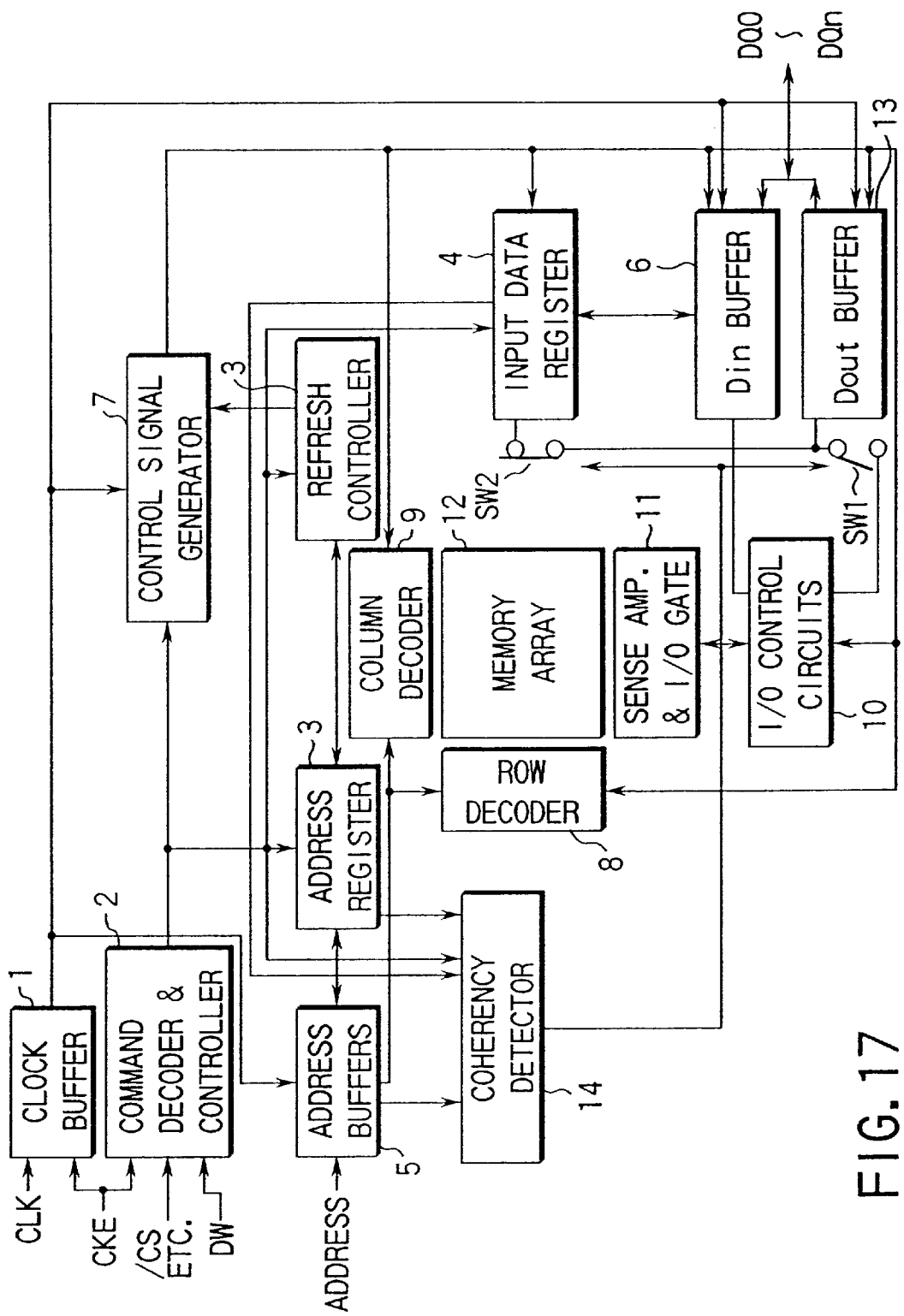
FIG. 17 is a block diagram of a DRAM according to a fourth embodiment of the present invention.

FIG. 17 is a block diagram schematically showing a DRAM according to the fourth embodiment. As clear from FIG. 17, the DRAM of the fourth embodiment is different from the DRAM shown in FIG. 15 particularly in that a refresh controller 15 is additionally provided.

When a refresh command is decoded by the command decoder and controller 2, the refresh controller 15 determines whether "the delayed write operation" has been set before the present command cycle. If the result of the determination is "TRUE", i.e., if "the delayed write operation" has been set, the refresh controller 15 immediately activates the control signal generator 7, so that a write operation for an address stored in the address register 3 can be started. As a result, the delayed write data stored in the input data register 4 is written into the memory cell. Subsequently, the normal refresh operation is started. Thus, the aforementioned resume function can be performed.

Concrete examples of the control signal generator 7, the coherency detector 14 and the refresh controller 15 will be described below.

Control Signal Generator 7

Figures 18A, 18B, 18C:
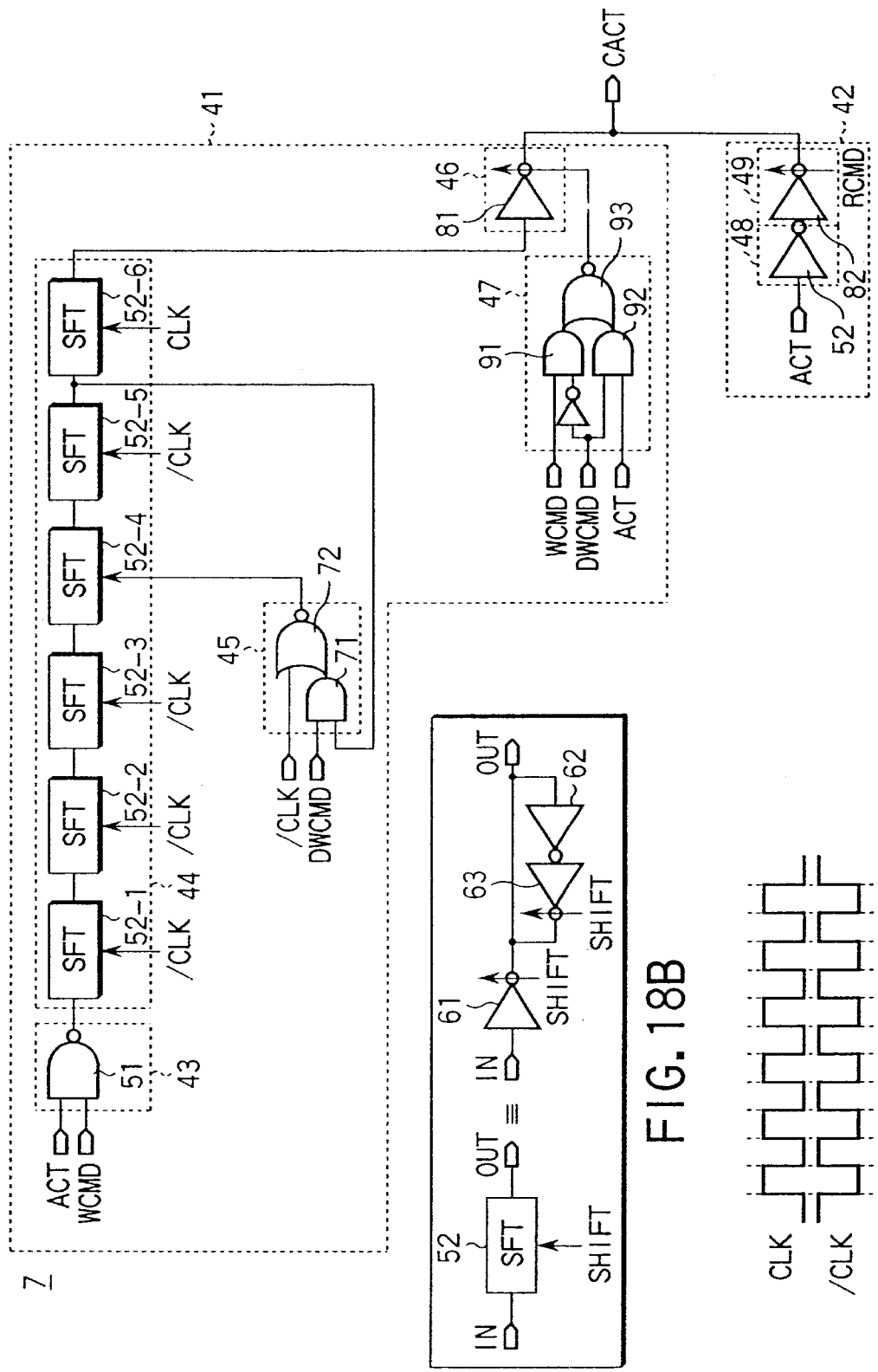
FIG. 18A is a circuit diagram showing an example of the control signal generator.
FIG. 18B is a circuit diagram showing an example of the shift register.
FIG. 18C is a timing chart showing clocks CLK and/CLK.

FIG. 18A is a circuit diagram showing an example of the control signal generator 7.

As shown in FIG. 18A, the control signal generator 7 of this example comprises a control signal generating circuit 41 for a write operation and a control signal generating circuit 42 for a read operation.

The control signal generating circuit 41 for a write operation includes an input circuit 43, a shift register circuit 44, a control circuit 45 for a delayed write operation, an output circuit 46 and an output control circuit 47.

The input circuit 43 is constituted by, for example, a NAND gate circuit 51. A peripheral circuits active signal ACT and a write command active signal WCMD are input to the NAND gate circuit 51. An output of the NAND gate circuit 51 is input to the shift register circuit 44.

The shift register circuit is constituted by, for example, six shift registers 52 (52-1 to 52-6) connected in series. An example of the shift registers 52 is shown in FIG. 18B.

As shown in FIG. 18B, the shift register 52 includes a clocked inverter 61, an inverter 62 which receives an output from the clocked inverter 61, and a clocked inverter 63 which receives an output from the inverter 62. An output of the clocked inverter 61 is controlled by a signal SHIFT, and an output of the clocked inverter 63 is controlled by a signal /SHIFT having a phase shifted by 180° from the signal SHIFT. The output of the clocked inverter 63 is connected to the output of the clocked inverter 61. The shift register 52 outputs an output OUT, a signal level of which is the inverse of that of an input signal IN, when the signal SHIFT is "HIGH" and the signal/SHIFT is "LOW". The shift register 52 maintains the signal level (information) of the output OUT, when the signal SHIFT is "LOW" and the signal/ SHIFT is "HIGH". The signal SHIFT corresponds to the clock CLK or /CLK in FIG. 18A.

Basically, the clock CLK in synchronism with an external clock and the clock/CLK 180° phase-shifted from the clock CLK are alternately input to the six shift registers 52-1 to 52-6, for the purpose of shifting the information maintained in the respective shift registers 52-1 to 52-6. The timings of the clocks CLK and /CLK are shown in FIG. 18C.

The clock CLK is input to the fourth shift register 52-4 via the control circuit 45 for a delayed write operation, so that the shift operation of the shift register 52-4 can be stopped in a delayed write operation.

The control circuit 45 is, for example, a combinational logic circuit constituted by an AND gate circuit 71 and a NOR gate circuit 72. A delayed write command active signal DWCMD and an output from the fifth shift register 52-5 are input to the AND gate circuit 71. The clock/CLK and an output from the AND gate circuit 71 are input to the NOR gate circuit 72. An output from the NOR gate circuit 72 functions as a clock CLK and input to the fourth shift register 52-4. An output from the last shift register 52-6 is input to the output circuit 46.

The output circuit 46 is constituted by, for example, a clocked inverter 81. An output of the clocked inverter circuit is controlled by an output of the output control circuit 47.

The output control circuit 47 is, for example, a combinational logic circuit constituted by AND gate circuits 91 and 92, and a NOR gate circuit 93. A signal WCMD is input to the AND gate circuit 91, together with a signal whose level is the inverse of that of a signal DWCMD. The signal DWCMD and the signal ACT are input to the AND gate circuit 92. Outputs from the AND gate circuits 91 and 92 are input to the clocked inverter 81. The clocked inverter 81 outputs a core circuits active signal CACT in synchronism with the signal ACT, when an output from the output control circuit 47 is "HIGH".

The control signal generating circuit 42 for a read operation includes an input circuit 48 and an output circuit 49.

The input circuit 48 is constituted by, for example, an inverter 52. The signal ACT is input to the inverter 52. An output from the inverter 52 is input to the output circuit 49.

The output circuit 49 is constituted by, for example, a clocked inverter 82. An output of the clocked inverter 82 is controlled by a read command active signal RCMD. The clocked inverter 82 outputs a core circuits active signal CACT in synchronism with the signal ACT, when the signal RCMD is "HIGH".

An operation of the above structure will be described.

Normal Write Operation

In a normal write operation, the signal WCMD is "HIGH", the signal DWCMD is "LOW" and the signal RCMD is "LOW".

As a result, the control signal generating circuit 41 for a write operation activates the signal CACT at a timing 3 clock cycles later than the activation of the signal ACT.

Delayed Write Operation

In a delayed write operation, the signal WCMD is "HIGH", the signal DWCMD is "HIGH" and the signal RCMD is "LOW".

As a result, the shift register circuit 44 stops the shift operation after 2.5 clocks have passed since the activation of the signal ACT. Accordingly, the output of the last shift register 52-6 is kept "LOW". In the next write cycle, the output control circuit 47 activates the signal CACT in synchronism with the activation of the signal ACT.

Read Operation

In a read operation, the signal WCMD is "LOW", the signal DWCMD is "LOW" and the signal RCMD is "HIGH".

As a result, the control signal generating circuit 42 for a read operation activates the signal CACT in synchronism with the activation of the signal ACT.

Coherency Detector 14

Figure 19:
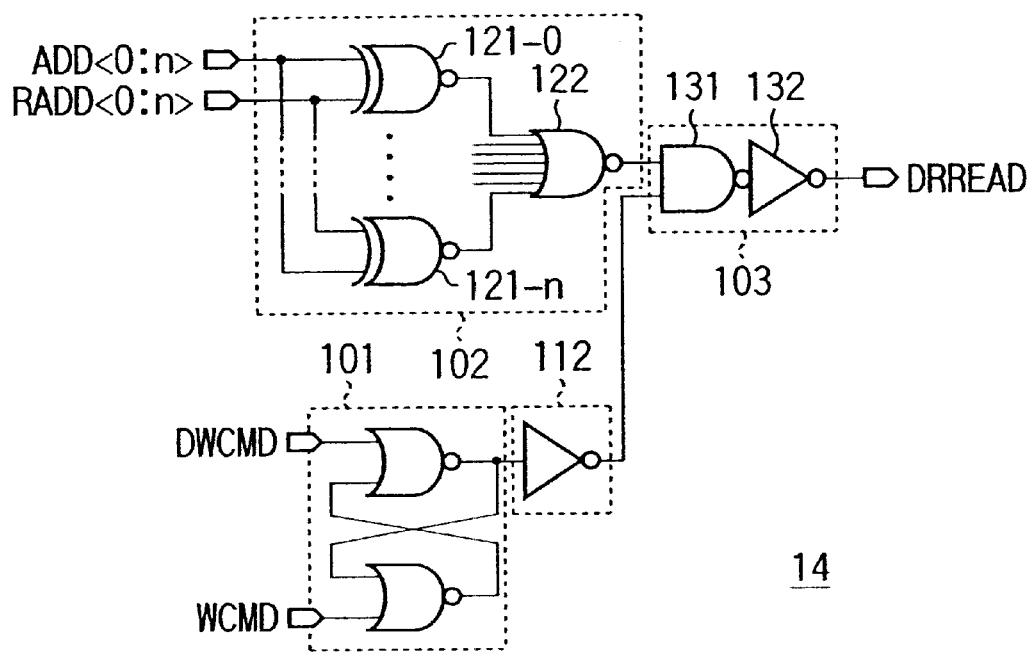
FIG. 19 is a circuit diagram showing an example of the coherency detector.

FIG. 19 is a circuit diagram showing an example of the coherency detector 14.

As shown in FIG. 19, the coherency detector 14 of this example comprises a register circuit 101, an address comparison circuit 102 and an output circuit 103. The register circuit 101 substantially corresponds to the register circuit 33 shown in FIG. 16B, and the address comparison circuit 102 and the output circuit 103 substantially correspond to the second checker 32 shown in FIG. 16B.

The register circuit 101 is, for example, a flip-flop circuit having NOR gate circuits. The register circuit 101 keeps its output level at "LOW", after a delayed write command is designated (DWCMD="HIGH") until a next write command is designated (WCMD="HIGH"). An output from the register circuit 101 is input to the output circuit 103 via a buffer 112. The buffer 112 is, for example, an inverter. When the level of an output of the register circuit 101 is "LOW", the inverter outputs a "HIGH" signal, thereby enabling the output circuit 103.

The address comparison circuit 102 is, for example, a combinational logic circuit constituted by an (n+1) number of EX-NOR gate circuits 121-0 to 121-n and a NOR gate circuit 122. Address information ADD <0:n> from the address buffers 5 and address information RADD <0:n> from the address register 3 are input to each of the EX-NOR gate circuits 121-0 to 121-n. Outputs from the EX-NOR gate circuits 121-0 to 121-n are input to the NOR gate circuit 122. An output from the NOR gate circuit 122 is input to the output circuit 103. The address comparison circuit 102 outputs a "HIGH" signal, when the address information ADD <0:n> completely coincides with the address information RADD <0:n>.

The output circuit 103 is, for example, an AND circuit including a NAND gate circuit 131 and an inverter 132. The output circuit 103 activates an input data register read signal DRREAD, when both the outputs of the buffer 112 and the address comparison circuit 102 are "HIGH" in level. When the signal DRREAD is activated, data is read from the input data register 4, not a memory cell.

Thus, the coherency detector 14 controls a reading operation such that data is read from the input data register 4, when the address information ADD <0:n> completely coincides with the address information RADD <0:n>, after a delayed write command is designated until a next write command is designated.

Refresh Controller 5

Figure 20:
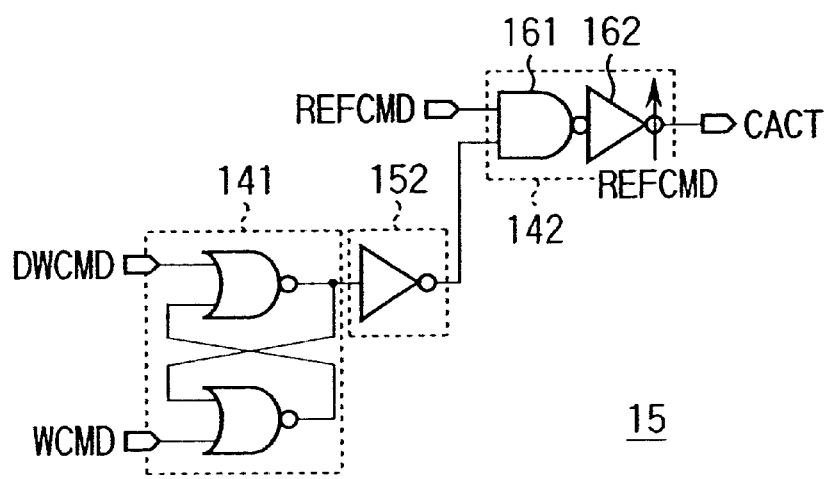
FIG. 20 is a circuit diagram showing an example of the refresh controller.

FIG. 20 is a circuit diagram showing an example of the refresh controller 15.

As shown in FIG. 20, the refresh controller 15 of this example includes a register circuit 141 and an output circuit 142.

The register circuit 141 is, for example, a flip-flop circuit similar to the register circuit 101 of the coherency detector 14. Therefore, the register circuit 141 keeps its output level at "LOW", after a delayed write command is designated (DWCMD="HIGH") until a next write command is designated (WCMD="HIGH"). An output from the register circuit 141 is input to the output circuit 142 via a buffer 152. The buffer 152 is, for example, an inverter. When the level of an output of the register circuit 141 is "LOW", the inverter outputs a "HIGH" signal, thereby enabling the output circuit 142.

The output circuit 142 is, for example, an AND circuit including a NAND gate circuit 161 and a clocked inverter 162. An output from the buffer 152 and a refresh command activation signal REFCMD are input to the NAND gate circuit 161. An output from the NAND gate circuit 161 is input to the clocked inverter 162. An output of the clocked inverter 162 is controlled by the signal REFCMD. The output circuit 142 activates the signal CACT, when both the signal REFCMD and the output from the buffer 152 are "HIGH" in level. When the signal CACT is activated, a core circuit is activated, so that data can be written in a memory cell.

As described above, when the refresh command activation signal REFCMD is designated in a period after a delayed write command is designated until a next write command is designated, the refresh control circuit 15 controls an operation of writing data into a memory cell by activating the signal CACT immediately after starting a refresh operation.

The present invention is not limited to the first to fourth embodiments described above, but can be various modified within the gist of the present invention.

Although the conventional art and the above embodiments relate to DRAMs, the present invention can be applied to other types of memory, such as FRAMs or PROMs, in which W.L. and R.L. are set to the same clock cycle value and particularly the start timing of the write operation is set later than the start timing of the read operation in the chip.

According to the present invention, it is possible to provide a semiconductor memory device comprising a memory section including memory cells from which information can be read out in response to a read command and in which information can be written in response to a write command, wherein high data transfer efficiency can be obtained in any of continuous read operations, continuous write operations and continuous read/write operations.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:

a memory cell array including memory cells;

a command decoder which detects whether an input command is a write operation or a refresh operation;

an address register which stores address information of a cell to be written to when the write operation has been detected;

an input data register which stores write data information to be stored in the cell to be written to when the write operation has been detected; and a refresh controller which causes the data information stored in the input data register to be written in the memory cell array in accordance with the address information stored in the address register when the refresh operation is detected, and causes the refresh operation to be started after the writing.

2. A semiconductor memory device comprising:

a memory cell array including memory cells;

a command decoder which detects whether an input command is a normal write operation, delayed write operation or refresh operation;

an address register which stores address information of a cell to be written to when the delayed write operation has been detected;

an input data register which stores write data information to be stored in the cell to be written to when the delayed write operation has been detected; and a refresh controller which determines whether or not the delayed write operation has been detected when the refresh operation has been detected, and when the delayed write operation has been detected, said refresh controller causes the data information stored in the input data register to be written to the memory cell array in accordance with the address information stored in the address register, and then causes the refresh operation to be started after the writing.

* * * * *

UNITED STATES PATENT AND TRADEMARK OFFICE
CERTIFICATE OF CORRECTION

PATENT NO. : 6,615,309 B2  
DATED : September 2, 2003  
INVENTOR(S) : Kenji Tsuchida et al.

It is certified that error appears in the above-identified patent and that said Letters Patent is hereby corrected as shown below:

<u>Title page,</u>  
Item [57], ABSTRACT,  
Line 2, -- and -- has been inserted before "a word line";  
Line 5, -- the -- has been inserted before "read operation".

Signed and Sealed this

Twenty-seventh Day of January, 2004

JON W. DUDAS  
*Acting Director of the United States Patent and Trademark Office*